(12) United States Patent
Yuan

(10) Patent No.: US 11,211,010 B2
(45) Date of Patent: Dec. 28, 2021

(54) DISPLAY PANEL AND DRIVING METHOD THEREOF, AND DISPLAY DEVICE

(71) Applicant: Xiamen Tianma Micro-Electronics Co., Ltd., Xiamen (CN)

(72) Inventor: Yong Yuan, Shanghai (CN)

(73) Assignee: XIAMEN TIANMA MICRO ELECTRONICS CO., LTD., Xiangan District (CN)

( * ) Notice: Subject to any disclaimer, the term of this patent is extended or adjusted under 35 U.S.C. 154(b) by 0 days.

(21) Appl. No.: 17/125,745

(22) Filed: Dec. 17, 2020

(65) Prior Publication Data
US 2021/0104196 A1 Apr. 8, 2021

(30) Foreign Application Priority Data
Oct. 15, 2020 (CN) .......................... 202011104835.3

(51) Int. Cl.
*G09G 3/30* (2006.01)
*G09G 3/32* (2016.01)
*G09G 3/3258* (2016.01)
*G09G 3/3266* (2016.01)
*G09G 3/3291* (2016.01)
*H01L 27/32* (2006.01)
(Continued)

(52) U.S. Cl.
CPC ......... *G09G 3/3258* (2013.01); *G09G 3/3266* (2013.01); *G09G 3/3291* (2013.01); *H01L 27/3262* (2013.01); *G09G 2300/0443* (2013.01); *G09G 2320/02* (2013.01); *H01L 27/1225* (2013.01); *H01L 29/7869* (2013.01); *H01L 29/78696* (2013.01)

(58) Field of Classification Search
CPC ...... G09G 3/32; G09G 3/3258; G09G 3/3266; G09G 3/3291; G09G 2320/02; G09G 2300/0443; G09G 3/34; G09G 3/30; H01L 27/32; H01L 27/3262; H01L 29/78; H01L 29/78696; H01L 29/7869; H01L 27/1225
See application file for complete search history.

(56) References Cited

U.S. PATENT DOCUMENTS 8,519,915 B2 * 8/2013 Asano ................... H01L 27/124
345/76
10,930,210 B2 * 2/2021 Lee ....................... G09G 3/3233
(Continued)

*Primary Examiner* — Pegeman Karimi
(74) *Attorney, Agent, or Firm* — Christensen O'Connor Johnson Kindness PLLC

(57) ABSTRACT

A display panel and a driving method thereof, and a display device are provided. The display panel includes pixel circuits. Each pixel circuit includes a driving transistor, a data writing circuit, a light-emitting control circuit, a threshold compensation circuit and a bias adjustment circuit. The driving transistor includes a gate electrically connected to a first node, a first terminal electrically connected to a second node, and a second terminal electrically connected to the third node, and is configured to generate a driving current. The third node is connected to a light-emitting element through the light-emitting control circuit. The bias adjustment circuit is configured to provide a signal of a bias adjustment signal terminal to the second node under control of a signal of a first scanning signal terminal in such a manner that a bias state of the driving transistor is adjusted.

33 Claims, 11 Drawing Sheets

(51) Int. Cl.
  *H01L 27/12*  (2006.01)
  *H01L 29/786*  (2006.01)

(56) References Cited

U.S. PATENT DOCUMENTS

| | | | |
|---|---|---|---|
| 2006/0244695 A1* | 11/2006 | Komiya | G09G 3/006 345/76 |
| 2021/0201773 A1* | 7/2021 | Liu | G09G 3/3233 |
| 2021/0233988 A1* | 7/2021 | Wei | H01L 27/3272 |

* cited by examiner

S301

Determining a driving mode of the display panel, driving the pixel circuit to operate in the data writing stage and the light-emitting stage in a case where the driving mode is a high-frequency driving mode, and driving the pixel circuit to operate in the bias adjustment stage, the data writing stage, and the light-emitting stage in a case where the driving mode is a low-frequency driving mode

Prior to driving the display panel to display an image frame, determining whether an image to be displayed is the same as a previous image frame, where in a case where the image to be displayed is the same as the previous image frame, a process of said driving the display panel to display the image frame comprises: driving at least one of the plurality of pixel circuits to operate in the data writing stage and the light-emitting stage; and in a case where the image to be displayed is different from the previous image frame, the process of said driving the display panel to display the image frame comprises: driving at least one of the plurality of pixel circuits to operate in the bias adjustment stage, the data writing stage, and the light-emitting stage

FIG. 13

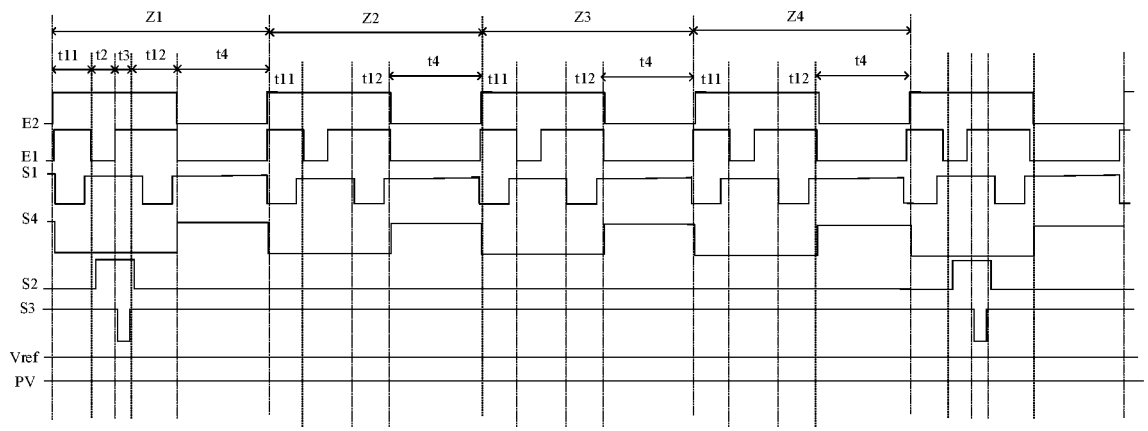

FIG. 14

DISPLAY PANEL AND DRIVING METHOD THEREOF, AND DISPLAY DEVICE

CROSS-REFERENCE TO RELATED DISCLOSURES

The present application claims priority to Chinese Patent Disclosure No. 202011104835.3, filed on Oct. 15, 2020, the content of which is incorporated herein by reference in its entirety.

TECHNICAL FIELD

The present disclosure relates to the field of display technologies and, in particular, to a display panel and a driving method thereof, and a display device.

BACKGROUND

An Organic Light Emitting Diode (OLED) has characteristics of self-luminescence, fast response, wide color gamut, large viewing angle and high brightness, and it can be made into thin display devices and flexible display devices and thus has gradually become a focus of research in the display technology field. The OLED is driven by current, and when being applied in the display field, configured to a driving transistor of the pixel circuit is configured to provide a driving current to the OLED so that the OLED is driven to emit light. It is necessary to provide a stable driving current to the OLED to ensure a display performance in the application. However, the driving transistor of the pixel circuit will have a problem of threshold voltage drift after long-term working, which affects the display effect.

SUMMARY

In a first aspect, an embodiment of the present disclosure provides a display panel includes a plurality of pixel circuits, and each pixel circuit includes a driving transistor, a data writing circuit, a light-emitting control circuit, a threshold compensation circuit, and a bias adjustment circuit. The driving transistor is configured to generate a driving current and comprises a gate, a first terminal, and a second terminal. The data writing circuit is configured to provide a data signal to the driving transistor. The light-emitting control circuit is connected in series with the driving transistor and a light-emitting element and configured to control whether the driving current flows through the light-emitting element or not. The threshold compensation circuit is connected in series between the gate and the second terminal of the driving transistor and configured to detect and self-compensate deviation of a threshold voltage of the driving transistor. The gate of the driving transistor is electrically connected to a first node, the first terminal of the driving transistor is electrically connected to a second node, the second terminal of the driving transistor is electrically connected to a third node, and the third node is connected to the light-emitting element through the light-emitting control circuit. The bias adjustment circuit comprises a control terminal electrically connected to a first scanning signal terminal, a first terminal electrically connected to a bias adjustment signal terminal, and a second terminal electrically connected to the second node. The bias adjustment circuit is configured to provide a signal of the bias adjustment signal terminal to the second node under control of a signal of the first scanning signal terminal in such a manner that a bias state of the driving transistor is adjusted.

In a second aspect, an embodiment of the present disclosure further provides a driving method of a display panel, and the display panel includes a plurality of pixel circuits, and each of the plurality of pixel circuits includes a driving transistor, a data writing circuit, a light-emitting control circuit, a threshold compensation circuit, and a bias adjustment circuit. The driving transistor is configured to generate a driving current and comprises a control terminal, a first terminal, and a second terminal. The data writing circuit is configured to provide a data signal to the driving transistor. The light-emitting control circuit is connected in series with the driving transistor and a light-emitting element and configured to control whether the driving current flows through the light-emitting element or not. The threshold compensation circuit is connected in series between the control terminal and the second terminal of the driving transistor and configured to detect and self-compensate deviation of a threshold voltage of the driving transistor. A gate of the driving transistor is electrically connected to a first node, the first terminal of the driving transistor is electrically connected to a second node, the second terminal of the driving transistor is electrically connected to a third node, and the third node is connected to the light-emitting element through the light-emitting control circuit. The bias adjustment circuit comprises a control terminal electrically connected to a first scanning signal terminal, a first terminal electrically connected to a bias adjustment signal terminal, and a second terminal electrically connected to the second node. The bias adjustment circuit is configured to provide a signal of the bias adjustment signal terminal to the second node under control of a signal of the first scanning signal terminal in such a manner that a bias state of the driving transistor is adjusted. A driving period of each of the plurality of pixel circuits comprises a bias adjustment stage, a data writing stage, and a light-emitting stage, wherein the bias adjustment stage comprises a first bias adjustment stage. The driving method includes: in the first bias adjustment stage, providing, by the bias adjustment circuit, a signal of the bias adjustment signal terminal to the second node under control of a signal of the first scanning signal terminal in such a manner that a bias state of the driving transistor is adjusted; in the data writing stage, writing, by the data writing circuit, a data signal into the gate of the driving transistor and detecting and self-compensating, by the threshold compensation circuit, the deviation of the threshold voltage of the driving transistor; and in the light-emitting stage, controlling, by the light-emitting control circuit, the driving current provided to the light-emitting element.

In a third aspect, an embodiment of the present disclosure further provides a display device, including a display panel. The display panel includes a plurality of pixel circuits. Each of the plurality of pixel circuits includes: a driving transistor configured to generate a driving current and comprising a gate, a first terminal, and a second terminal; a data writing circuit configured to provide a data signal to the driving transistor; a light-emitting control circuit connected in series with the driving transistor and a light-emitting element and configured to control whether the driving current flows through the light-emitting element or not; a threshold compensation circuit connected in series between the gate and the second terminal of the driving transistor and configured to detect and self-compensate deviation of a threshold voltage of the driving transistor, wherein the gate of the driving transistor is electrically connected to a first node, the first terminal of the driving transistor is electrically connected to a second node, the second terminal of the driving transistor is electrically connected to a third node, and the third node is connected to the light-emitting element through the light-emitting control circuit; and a bias adjustment circuit comprising a control terminal electrically connected to a first scanning signal terminal, a first terminal electrically connected to a bias adjustment signal terminal, and a second terminal electrically connected to the second node, wherein the bias adjustment circuit is configured to provide a signal of the bias adjustment signal terminal to the second node under control of a signal of the first scanning signal terminal in such a manner that a bias state of the driving transistor is adjusted.

BRIEF DESCRIPTION OF DRAWINGS

In order to explain the embodiments of the present disclosure or the technical solutions in the related art more clearly, the drawings that need to be used in the description of the embodiments or the related art will be briefly introduced below. The drawings in the following description are some embodiments of the present disclosure, and for those skilled in the art, other drawings can be obtained based on these drawings.

FIG. 12 is a flowchart of a driving method of a display panel provided by an embodiment of the present disclosure;

FIG. 13 is a flowchart of a driving method of a display panel provided by an embodiment of the present disclosure;

FIG. 14 is a driving timing diagram of a driving method of a display panel provided by an embodiment of the present disclosure.

DESCRIPTION OF EMBODIMENTS

In order to make the objectives and technical solutions of the embodiments of the present disclosure clearer, the technical solutions provided in the embodiments of the present disclosure are described clearly and completely below with reference to the drawings in the embodiments of the present disclosure. The described embodiments are part of the embodiments of the present disclosure, rather than all the embodiments. Based on the embodiments of the present disclosure, all other embodiments obtained by those of ordinary skill in the art shall fall within the protection scope of the present disclosure.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

In the related art, the driving transistor of the pixel circuit works in a forward bias state to provide a driving current to the light-emitting element, and when the driving transistor works in a bias state for a long time, the threshold shift will occur, which will affect the display effect. Based on this, an embodiment of the present disclosure provides a pixel circuit, a bias adjustment circuit is added in the pixel circuit, the bias adjustment circuit is electrically connected to the first terminal of the driving transistor, by controlling the bias adjustment circuit, a level signal is written to the first terminal of the driving transistor at a moment at which the pixel circuit operates, in such a manner that the bias state of the driving transistor is adjusted, which improves the threshold drift of the driving transistor. When the pixel circuit is applied in the display panel, influence of the threshold drift on the display can be improved and the display effect is enhanced.

Figure 1:
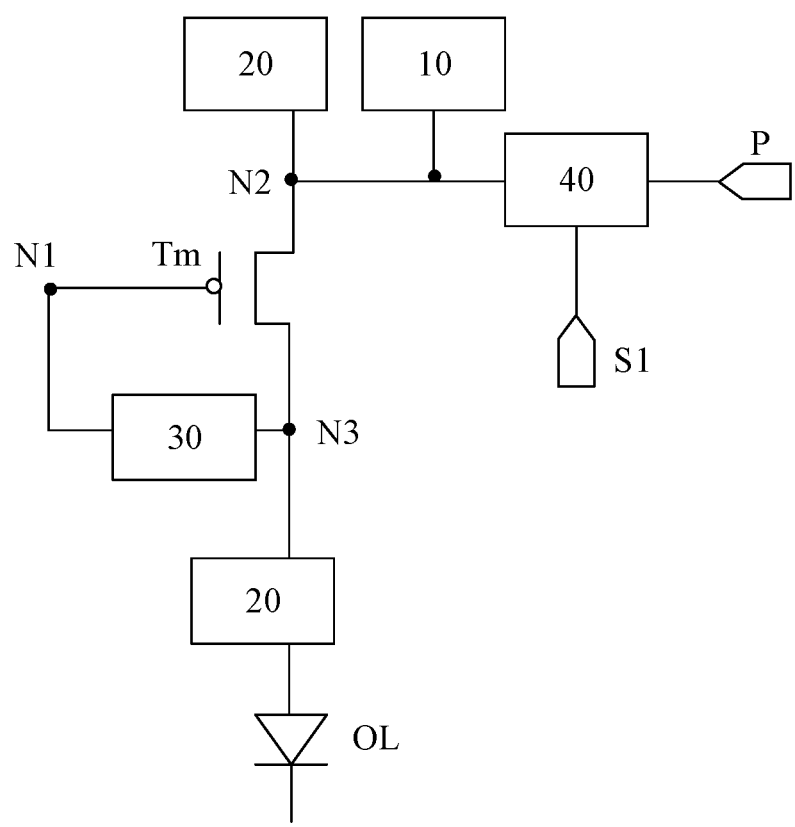
FIG. 1 is a block diagram of a pixel circuit provided by an embodiment of the present disclosure.

FIG. 1 is a block diagram of a pixel circuit provided by an embodiment of the present disclosure. As shown in FIG. 1, the pixel circuit includes a driving transistor Tm, a data writing circuit 10, a light-emitting control circuit 20, a threshold compensation circuit 30, and a bias adjustment circuit 40.

The data writing circuit 10 is configured to provide a data signal to the driving transistor Tm. The light-emitting control circuit 20, the driving transistor Tm, and a light-emitting element OL are connected in series to, and the light-emitting control circuit 20 is configured to control whether a driving current flows through the light-emitting element OL. The threshold compensation circuit 30 is connected in series between a control terminal of the driving transistor Tm and a second terminal of the driving transistor Tm and configured to detect and self-compensate deviation of a threshold voltage of the driving transistor Tm. When the pixel circuit is applied to a display panel, the threshold compensation circuit 30 can improve a problem of display unevenness caused by difference in the threshold voltage of the driving transistor caused by a manufacturing process and the drift of the threshold voltage of the driving transistor caused by aging of the transistor and so on.

A gate of the driving transistor Tm is electrically connected to a first node N1, a first terminal of the driving transistor Tm is electrically connected to a second node N2, and the second terminal of the driving transistor Tm is electrically connected to a third node N3. The driving transistor Tm is configured to generate a driving current, and the third node N3 is connected to the light-emitting element OL through the light-emitting control circuit 20. The first terminal of the driving transistor Tm is a source terminal, and the second terminal of the driving transistor Tm is a drain terminal.

A control terminal of the bias adjustment circuit 40 is electrically connected to a first scanning signal terminal S, a first terminal of the bias adjustment circuit 40 is electrically connected to a bias adjustment signal terminal P, and a second terminal of the bias adjustment circuit 40 is electrically connected to the second node N2. The bias adjustment circuit 40 is configured to, under control of a signal of the first scanning signal terminal S1, provide a signal of the bias adjustment signal terminal P to the second node N2 in such a manner that a bias state of the driving transistor Tm is adjusted.

A driving period in which the pixel circuit drives the light-emitting element to display includes a light-emitting stage, and in the light-emitting stage, a potential of the gate of the driving transistor is higher than a potential of the drain of the driving transistor, and a forward bias of the driving transistor causes a hysteresis effect in the driving transistor. Such setting, when applied for a long time, will cause ions inside the driving transistor to be polarized. As a result, a built-in electric field will be formed inside the driving transistor, causing the threshold voltage of the driving transistor to continue to increase, and the drift of the threshold voltage will cause display brightness to be unstable when the pictures are switched, causing the human eye to sense flicker of the screen. In other words, in applications, the hysteresis effect of the driving transistor has a relatively large effect on the display effect. The threshold voltage shift caused by the hysteresis effect is at a ns level, while the compensation threshold of the threshold compensation circuit in some conventional pixel circuits is at a μs or ms level, and the threshold compensation circuit in these conventional pixel circuits cannot compensate the threshold voltage shift caused by the hysteresis effect.

A working process of the pixel circuit provided by an embodiment of the present disclosure can include a bias adjustment stage, a data writing stage, and a light-emitting stage. During the data writing stage, the data signal is written to the gate of the driving transistor Tm by the data writing circuit 10, and at the same time, the threshold compensation circuit 30 detects and self-compensates the deviation of the threshold voltage of the driving transistor at this stage. In the light-emitting stage, the light-emitting control circuit 20 controls a driving current provided to the light-emitting element OL to realize the light-emitting of the light-emitting element OL. The bias adjustment stage in the embodiment of the present disclosure includes a first bias adjustment stage, and the first bias adjustment stage is prior to a gate resetting stage. In the first bias adjustment stage, the first scanning signal terminal S1 is controlled to provide an effective level signal in such a manner that the signal of the bias adjustment signal terminal P is provided to the second node N2, and the first terminal of the driving transistor Tm is electrically connected to the second node N2 in such a manner that a bias state of the driving transistor Tm is adjusted to a reverse bias state, which reverses the source and the drain of the driving transistor, decreases degree of polarization of the ions inside the driving transistor Tm and lowers the threshold voltage of the driving transistor Tm, and achieving the adjustment of the threshold voltage of the driving transistor Tm by biasing the driving transistor Tm. The threshold voltage drift caused by the hysteresis effect occurs in the driving transistor caused by the forward bias state of the driving transistor is compensated, and application of the pixel circuit in the display panel can improve the influence of the driving transistor on the display effect due to the hysteresis effect, which improves the display effect. In the embodiment of the present disclosure, the bias adjustment circuit works in the bias adjustment stage, the bias adjustment stage and the data writing stage are independent from each other, and a working logic of the pixel circuit is relatively straight forward.

In an embodiment, the bias adjustment stage further includes a second bias adjustment stage, the second bias adjustment stage is between the data writing stage and the light-emitting stage, that is, after the data writing stage and prior to the light-emitting stage, the pixel circuit executes steps performed in the second bias adjustment stage (i.e., the pixel circuit operates in the second bias adjustment stage). In the second bias adjustment stage, the first scanning signal terminal S1 is controlled to provide an effective level signal in such a manner that the signal of the bias adjustment signal terminal P is provided to the second node N2, and the first terminal of the driving transistor Tm is electrically connected to the second node N2 in such a manner that the bias state of the driving transistor Tm is adjusted. Two bias adjustment stages are included by the working cycle of the pixel circuit, which increases time for adjusting the bias state of the driving transistor in the driving period, and then improves the degree of improvement of the threshold voltage drift in the driving transistor due to the hysteresis effect.

Figure 2:
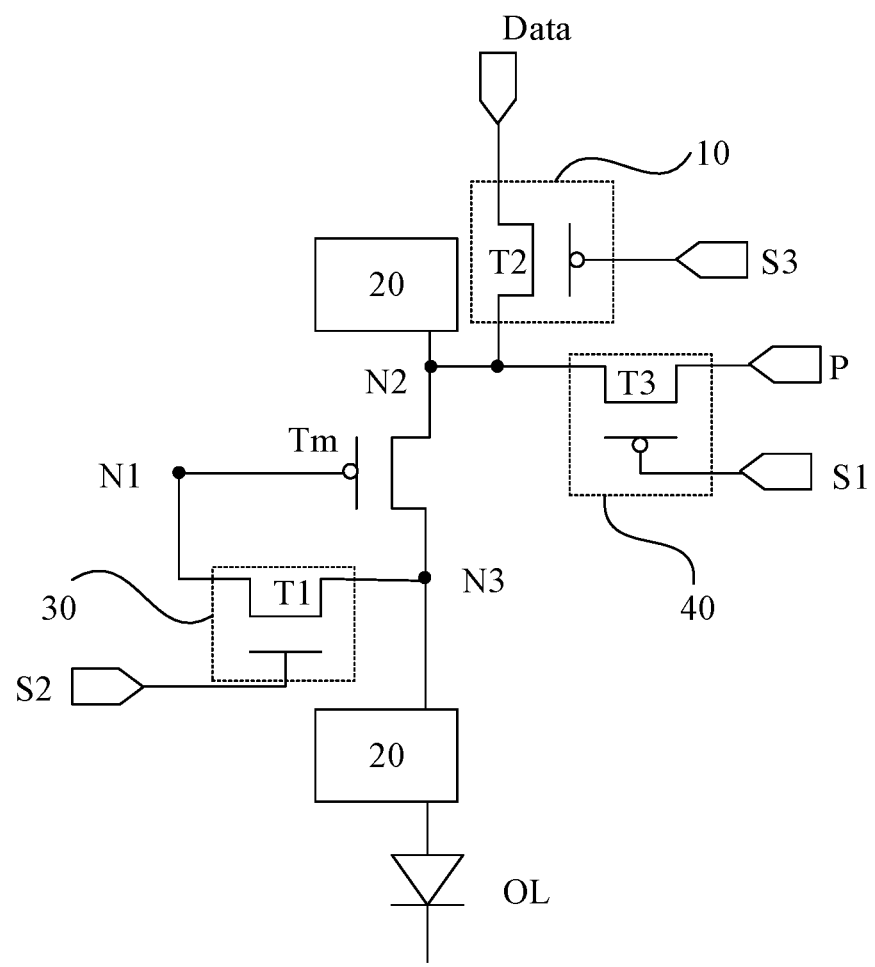
FIG. 2 is a schematic diagram of a pixel circuit provided by another embodiment of the present disclosure.

FIG. 2 is a schematic diagram of the pixel circuit provided by an embodiment of the present disclosure. As shown in FIG. 2, the threshold compensation circuit 30 includes a first transistor T1, a control terminal of the first transistor T1 is electrically connected to a second scanning signal terminal S2, a first terminal of the first transistor T1 is electrically connected to a third node N3, and a second terminal of the first transistor T1 is electrically connected to the first node N2. The first transistor T1 can conduct between the first terminal and the second terminal thereof under control of a signal of the second scanning signal terminal S2. When the pixel circuit of the present disclosure works in the data writing stage, the second scanning signal terminal S2 provides an effective level signal, to control the first transistor T1 to be turned on, to make the first terminal and the second terminal thereof be conducted, thereby achieving conduction between the gate and the second terminal of the driving transistor Tm, and thus compensating the threshold voltage of the driving transistor Tm during the data writing stage.

In an embodiment, the first transistor T1 includes an oxide semiconductor. In the present disclosure, the first transistor T1 is electrically connected to the first node N1, and when the first transistor T1 includes the oxide semiconductor, a leakage current of the first transistor T1 is relatively low when it is in an off state, which can reduce the influence of the leakage current on the potential of the first node N1, so as to stabilize a gate voltage of the driving transistor Tm and improve the working stability of the driving transistor Tm, thereby further ensuring the stability of the driving current. When the pixel circuit is applied to the display panel, the uniformity of the light-emitting brightness of the light-emitting element can be reached. For example, when the pixel circuit is applied in low-frequency drive display, the display period of an image frame is relatively long, then the time for which the potential of the first node N1 is to be maintained is also relatively long, and if the first transistor includes low-temperature polysilicon, its off-state leakage current is relatively large, then the leakage current of the first transistor has a relatively large impact on the potential of the first node N1, which causes obvious flicker. By such configuration in which the first transistor includes the oxide semiconductor, using a characteristic of the off-state leakage current being small can maintain the potential of the first node N1 for a long time at the time of the low-frequency drive display, which reduces the flicker phenomenon during low-frequency drive and improves the display effect.

In an embodiment, a channel length of the driving transistor Tm, a channel length of the transistor of the data writing circuit 10, a channel length of the transistor of the light-emitting control circuit 20, and a channel length of the transistor of the bias adjustment circuit 40 are all smaller than a channel length of the first transistor T1. In an embodiment, an active layer of the driving transistor Tm, an active layer of the transistor of the data writing circuit 10, an active layer of the transistor of the light-emitting control circuit 20 and an active layer of the transistor of the bias adjustment circuit 40 each include low temperature polysilicon. In the present embodiment, lengths of most transistors of the pixel circuit are all relatively small, so that space occupied by the whole pixel circuit can be reduced while reaching a satisfied turning-on speed when the transistor is used as a switching transistor, and when the pixel circuit is applied in the display panel, a density of the pixel circuit and the resolution of the display panel can be increased. In an embodiment, the first transistor includes an oxide semiconductor, and the channel length of the first transistor is set to be smaller than the channel lengths of other transistors of the pixel circuit, which can improve a controllable range of manufacturing process parameters of the first transistor and then reduce process difficulty of manufacturing the first transistor.

In an embodiment, the first transistor has the channel length within a range of 7 μm to 3 μm and has a channel width within a range of 2 μm to 4 μm. The transistors of the data writing circuit 10, the light-emitting control circuit 20, and the bias adjustment circuit 40 each have the channel lengths within a range of 5 μm to 2 μm and have channel widths within a range of 2 μm to 4 μm.

In an embodiment, a width-to-length ratio of the driving transistor Tm is smaller than a width-to-length ratio of each of the transistors of the data writing circuit 10, the light-emitting control circuit 20, the threshold compensation circuit 30, and the bias adjustment circuit 40. The driving transistor Tm has a relatively small width-to-length ratio, which can ensure that the driving transistor Tm has a relatively large subthreshold swing, and then the Id-Vg curve of the driving transistor Tm (a relationship curve between the drain current and the gate voltage of the driving transistor) is relatively gentle, ensuring that the driving transistor provides a smooth driving current to the light-emitting element to drive the light-emitting element to emit light. In an embodiment, the width-to-length ratio of the driving transistor Tm is within a range of 3/30 to 3/10. The transistors of the data writing circuit 10, the light-emitting control circuit 20, the threshold compensation circuit 30, and the bias adjustment circuit 40 are all used as switching transistors. A relatively large width-to-length ratio can make the switching transistor have a relatively small subthreshold swing. As a result, Id-Vg curve of the switching transistor is relatively steep, which provides that the switching transistors are characterized by fast turning-on and turning-off.

With continued reference to FIG. 2 above, the data writing circuit 10 includes a second transistor T2, a control terminal of the second transistor T2 is electrically connected to a third scanning signal terminal S3, a first terminal of the second transistor T2 is electrically connected to a data signal terminal Data, and a second terminal of the second transistor T2 is electrically connected to the second node N2. When the pixel circuit is working in the data writing stage, an effective level signal is provided through the third scanning signal terminal S3, to control the second transistor T2 to be turned on, in order to provide a voltage signal of the data signal terminal Data to the second node N2. At the same time, the driving transistor Tm, under the control of the gate voltage thereof, makes the first terminal and the second terminal thereof be conducted, to provide the voltage signal written in the second node N2 to the third node N3. In addition, the first transistor T1 in the threshold compensation circuit 30 provides the voltage signal of the third node N3 to the first node N1 under the control of the signal of the second scanning signal terminal S2 to realize writing of the data signal to the gate of the driving transistor Tm.

In an embodiment, as shown in FIG. 2, the bias adjustment circuit 40 includes a third transistor T3, a gate of the third transistor T3 is electrically connected to the first scanning signal terminal S1, a first terminal of the third transistor T3 is electrically connected to the bias adjustment signal terminal P, and a second terminal of the third transistor T3 is electrically connected to the second node N2. In the bias adjustment stage, the first scanning signal terminal S1 is controlled to provide an effective level signal to control the third transistor T3 to be conducted, to provide the signal of the bias adjustment signal terminal P to the second node N2, to control the potential of the second node N2 to be lower than the potential of the third node N3, to adjust the bias state of the driving transistor Tm and then reduce the threshold drift of the driving transistor due to the hysteresis effect. When applying the bias adjustment circuit 40 in the display panel, the influence of the driving transistor on the display effect due to the hysteresis effect can be reduced.

In an embodiment, a width-to-length ratio of the third transistor T3 is greater than the width-to-length ratio of the driving transistor Tm. That is, by configuring the third transistor T3 to have a relatively large width-to-length ratio, a turning-on speed of the third transistor T3 can be ensured, and when the first scanning signal terminal S1 provides an effective level signal, the signal of the bias adjustment signal terminal P can be quickly provided to the second node N2, thereby ensuring the time for adjusting the bias state of the driving transistor Tm to improve the degree of improvement of the driving transistor due to the hysteresis effect.

Figure 3:
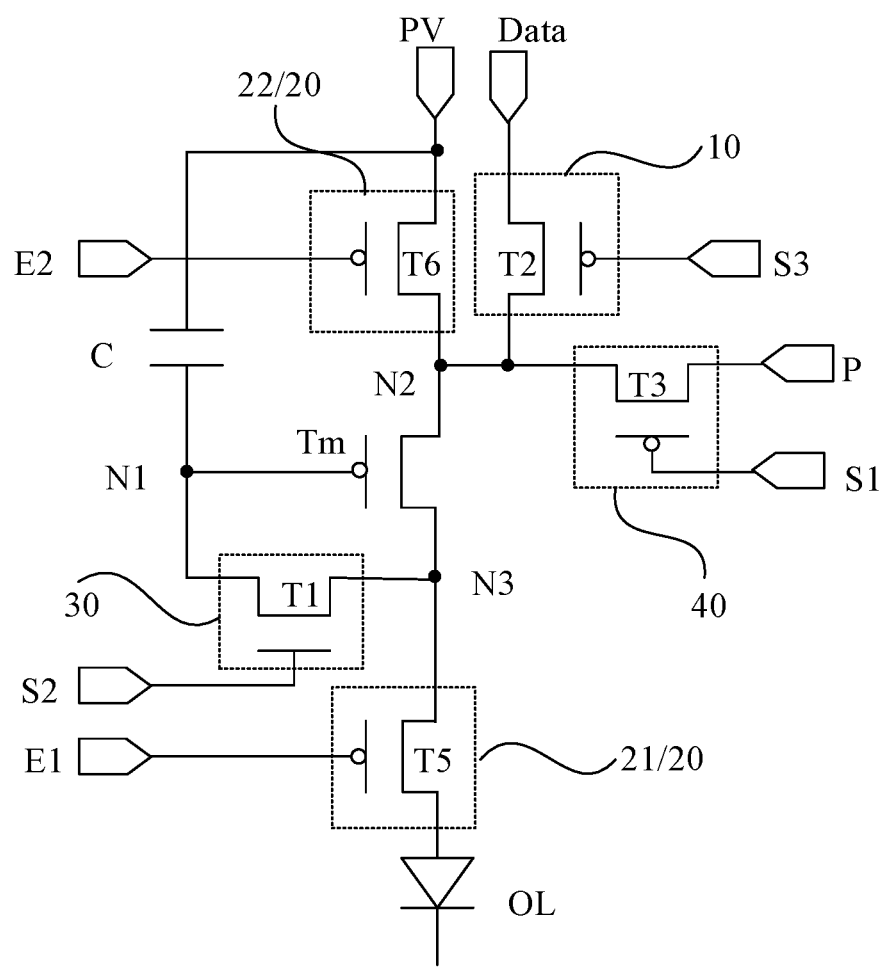
FIG. 3 is a schematic diagram of a pixel circuit provided by another embodiment of the present disclosure.

FIG. 3 is a schematic diagram of the pixel circuit provided by an embodiment of the present disclosure. In an embodiment, as shown in FIG. 3, the light-emitting control circuit 20 includes a first light-emitting control circuit 21 and a second light-emitting control circuit 22, a control terminal of the first light-emitting control circuit 21 is electrically connected to a first light-emitting signal terminal E1, a first terminal of the first light-emitting control circuit 21 is electrically connected to the third node N3, a second terminal of the first light-emitting control circuit 21 is electrically connected to the light-emitting element OL, a control terminal of the second light-emitting control circuit 22 is electrically connected to a second light-emitting signal terminal E2, a first terminal of the second light-emitting control circuit 22 is electrically connected to a power signal terminal PV, and a second terminal of the second light-emitting control circuit 22 is electrically connected to the second node N2. In an embodiment, a light-emitting element resetting circuit 50 is connected to an anode of the light-emitting element OL, and the power signal terminal PV is a positive power signal terminal.

When the pixel circuit is working in the light-emitting stage, the first light-emitting control circuit 21 and the second light-emitting control circuit 22 cooperate to provide a driving current to the light-emitting element OL, and the second light-emitting control circuit 22 provides the signal of the power signal terminal PV to the second node N2 under control of the signal of the second light-emitting signal terminal E2; the driving transistor Tm provides the voltage signal of the second node N2 to the third node N3 under the control of its gate voltage; the first light-emitting control circuit 21 provides the voltage signal of the third node N3 to an electrode of the light-emitting element OL under the control of the signal of the first light-emitting signal terminal E1, so as to realize that the driving current flows through the light-emitting element OL to control the light-emitting element OL to emit light.

In the present embodiment, the first light-emitting control circuit 21 and the second light-emitting control circuit 22 are controlled by different light-emitting signal terminals, and in the driving period of the pixel circuit, the first light-emitting control circuit 21 and the second light-emitting control circuit 22 can be separately controlled, which can reuse the first light-emitting control circuit 21 or the second light-emitting control circuit 22 in other working stages, to reduce the space occupied by the circuits of the pixel circuit structure and simplify the circuit structure. In an embodiment of the present disclosure, the first light-emitting control circuit can be reused in the stage in which the gate of the driving transistor is reset. This implementation is described in following embodiments.

In an embodiment, the first light-emitting control circuit 21 includes a fifth transistor T5, a gate of the fifth transistor T5 is electrically connected to the first light-emitting signal terminal E1, a first terminal of the fifth transistor T5 is electrically connected to the third node N3, and a second terminal of the fifth transistor T5 is electrically connected to the light-emitting element OL. The second light-emitting control circuit 22 includes a sixth transistor T6, a gate of the sixth transistor T6 is electrically connected to the second light-emitting signal terminal E2, a first terminal of the sixth transistor T6 is electrically connected to the power signal terminal PV, and a second terminal of the sixth transistor T6 is electrically connected to the second node N2.

When the pixel circuit is working in the light-emitting stage, the second light-emitting signal terminal E2 provides an effective level to control the first terminal and the second terminal of the fifth transistor T5 to be conducted with each other to provide the signal of the power signal terminal PV to the second node N2; the driving transistor Tm generates a driving current under the control of its gate voltage; the first light-emitting signal terminal E1 provides an effective level signal to control the first terminal and the second terminal of the sixth transistor T6 to be conducted with each other, then, the driving current is provided to the electrode of the light-emitting element OL, in order to achieved that the driving current flows through the light-emitting element OL to control the light-emitting element OL to emit light.

In an embodiment, as shown in FIG. 3, the pixel circuit further includes a storage capacitor C, which is configured to maintain the potential of the first node N1 during the light-emitting stage, in order to ensure that the first node N1 continues to provide an effective level signal to the gate of the driving transistor Tm during the light-emitting stage to control the first terminal and the second terminal of the driving transistor Tm to be conducted with each other.

Figure 4:
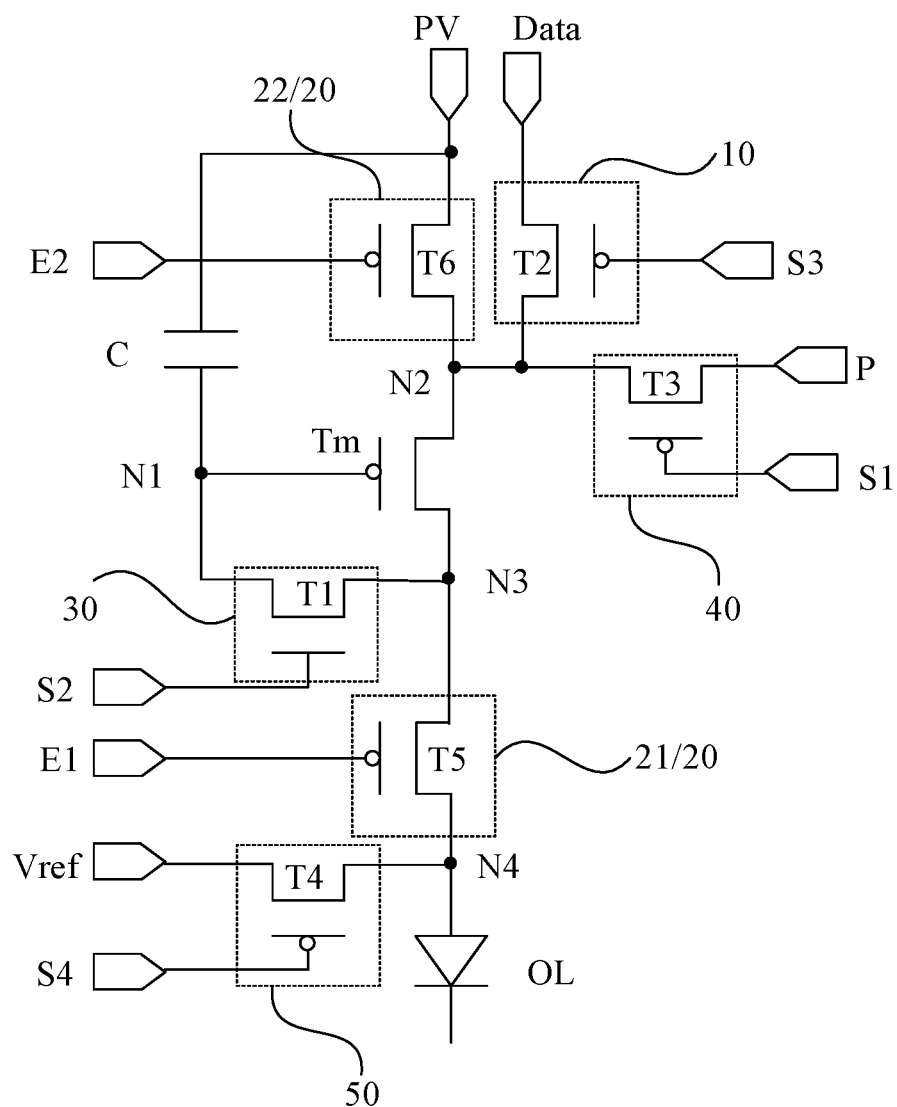
FIG. 4 is a schematic diagram of a pixel circuit provided by another embodiment of the present disclosure.

FIG. 4 is a schematic diagram of the pixel circuit according to an embodiment of the present disclosure. In an embodiment, as shown in FIG. 4, the pixel circuit further includes the light-emitting element resetting circuit 50 configured to reset the light-emitting element OL, a control terminal of the light-emitting element resetting circuit 50 is electrically connected to a fourth scanning signal terminal S4, a first terminal of the light-emitting element resetting circuit 50 is electrically connected to the reference voltage terminal Vref, and a second terminal of the light-emitting element resetting circuit 50 is electrically connected to the light-emitting element OL. By providing the light-emitting element resetting circuit 50 to reset the light-emitting element OL in order to avoid undesired light-emission of the light-emitting element OL, it can avoid affecting the display effect during application. As shown in the embodiment of FIG. 4, the light-emitting element resetting circuit 50 is connected to the anode of the light-emitting element OL, that is, the light-emitting element resetting circuit 50 is configured to reset the anode of the light-emitting element OL. In another embodiment, the light-emitting element resetting circuit 50 is connected to a cathode of the light-emitting element OL, that is, the light-emitting element resetting circuit 50 is configured to reset the anode of the light-emitting element OL (not shown in the drawings), and corresponding settings can be actually made according to a specific structure of the display panel in actual applications. It should be noted that an OLED device in related art is taken as an example for illustration here, and in other embodiments, the cathode of the light-emitting element OL can be connected to the pixel circuit.

In an embodiment, with reference to FIG. 4, the light-emitting element resetting circuit 50 includes a fourth transistor T4, a gate of the fourth transistor T4 is electrically connected to the fourth scanning signal terminal S4, a first terminal of the fourth transistor T4 is electrically connected to the reference voltage terminal Vref, and a second terminal of the fourth transistor T4 is electrically connected to the light-emitting element OL. In an embodiment, the working process of the pixel circuit further includes a light-emitting element resetting stage, and in the light-emitting element resetting stage, the fourth scanning signal terminal S4 provides an effective level signal to control the fourth transistor T4 to be turned on, to provide the signal of the reference voltage terminal Vref to the light-emitting element OL, so as to reset the light-emitting element OL, in order to avoid undesired light-emission of the light-emitting element OL.

In the embodiment of the present disclosure, the light-emitting element OL is controlled to be reset during a non-light-emitting stage. In an embodiment, the light-emitting element OL can be reset by the light-emitting element resetting circuit 50 in at least one of the bias adjustment stage and the data writing stage. In an embodiment, the light-emitting element OL is reset by the light-emitting element resetting circuit 50 in the bias adjustment stage, and/or the light-emitting element OL is reset by the light-emitting element resetting circuit 50 in the data writing stage. When the pixel circuit is working in the bias adjustment stage or the data writing stage, a coupling effect in the structure of the pixel circuit may cause the electrode potential of the light-emitting element OL to rise, thereby causing undesired light-emission of light-emitting element OL. In the embodiment of the present disclosure, in the bias adjustment stage and/or the data writing stage, the light-emitting element OL is reset at the same time, which can avoid undesired light-emission of the light-emitting element OL. Moreover, there is no need to add an extra stage for resetting the light-emitting element in the driving period of the pixel circuit, such that the time of the non-light-emitting stage in the pixel driving period can be shortened, which can shorten the time of a complete driving period of the pixel circuit, to increase response speed of the light-emitting element of the display panel.

In an embodiment of the present disclosure, the threshold compensation circuit 30, the first light-emitting control circuit 21, and the light-emitting element resetting circuit 50 are reused as a gate resetting circuit, and the gate resetting circuit is configured to reset the gate of the driving transistor Tm. In the application of the pixel circuit provided in the present embodiment, the gate of the driving transistor can be reset before the data writing stage, so as to ensure accuracy of writing signals to the gate of the driving transistor. Moreover, the circuits of the present embodiment are reused as a gate resetting circuit, and no additional gate resetting circuit is required, which simplifies the circuit structure of the pixel circuit.

In an embodiment, as shown in FIG. 4, the control terminal of the threshold compensation circuit 30 is electrically connected to the second scanning signal terminal S2, the control terminal of the first light-emitting control circuit 21 is electrically connected to the first light-emitting signal terminal E1, and the control terminal of the light-emitting element resetting circuit 50 is electrically connected to the fourth scanning signal terminal S4. The gate resetting circuit provides a reset signal to the gate of the driving transistor Tm under the control of the signal of the second scanning signal terminal S2, the signal of the fourth scanning signal terminal S4 and the signal of the first light-emitting signal terminal E1.

When the pixel circuit is working in the gate resetting stage, the light-emitting element resetting circuit 50 provides the reset signal of the reference voltage terminal Vref to the fourth node N4 under the control of the signal of the fourth scanning signal terminal S4; the first light-emitting control circuit 21 provides the signal of the fourth node N4 to the third node N3 under the control of the signal of the first light-emitting signal terminal E1; the threshold compensation circuit 30 provides the signal of the third node N3 to the first node N1 under the control of the signal of the second scanning signal terminal S2, so as to provide the reset signal to the gate of the driving transistor Tm to reset the gate.

Figure 5:
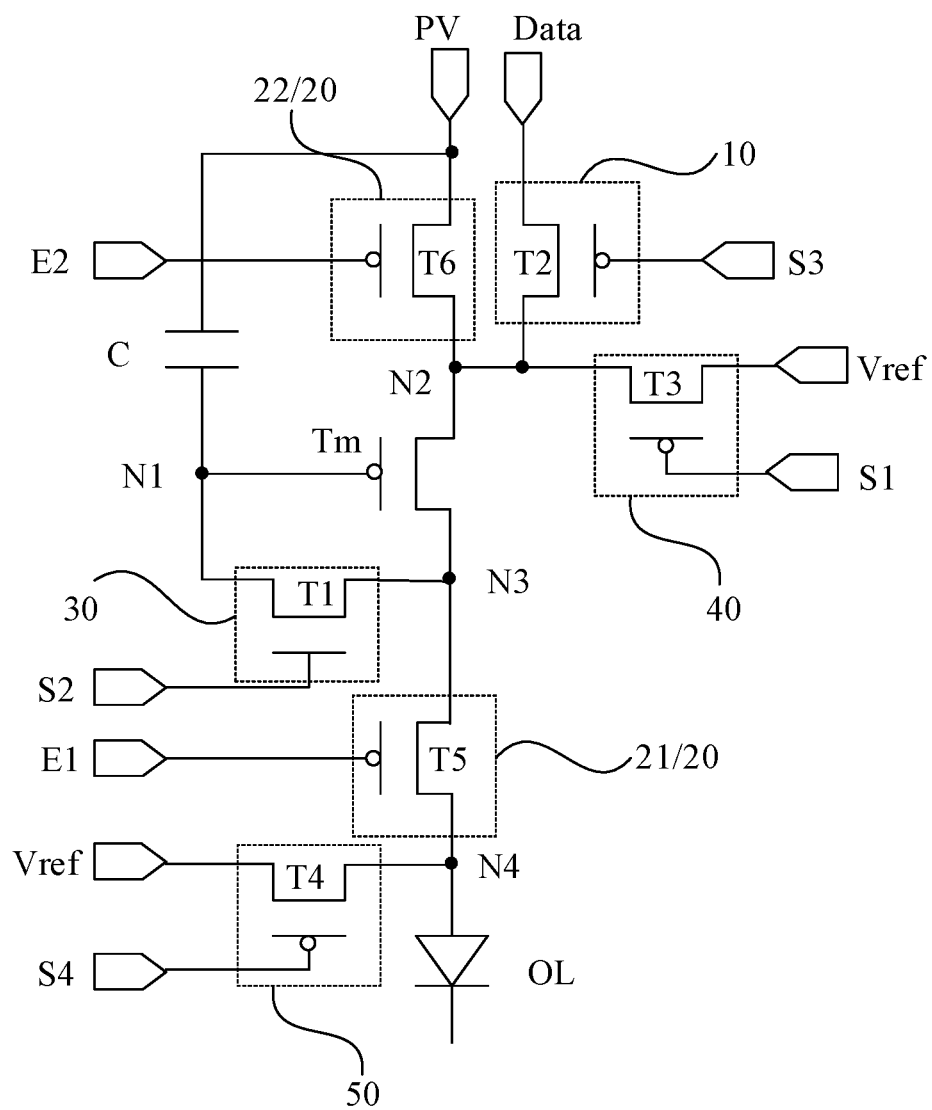
FIG. 5 is a schematic diagram of a pixel circuit provided by another embodiment of the present disclosure.

In an embodiment, the reference voltage terminal is reused as a bias adjustment signal terminal. FIG. 5 is a schematic diagram of the pixel circuit provided by the embodiment of the present disclosure. In an embodiment, as shown in FIG. 5, the pixel circuit includes a driving transistor Tm, a data writing circuit 10, a light-emitting control circuit 20, a threshold compensation circuit 30, a bias adjustment circuit 40, and a light-emitting element resetting circuit 50. The threshold compensation circuit 30 includes a first transistor T1, a control terminal of the first transistor T1 is electrically connected to the second scanning signal terminal S2, a first terminal of the first transistor T1 is electrically connected to the third node N3, and a second terminal of the first transistor T1 is electrically connected to the first node N2. The data writing circuit 10 includes a second transistor T2, a control terminal of the second transistor T2 is electrically connected to the third scanning signal terminal S3, a first terminal of the second transistor T2 is electrically connected to the data signal terminal Data, and a second terminal of the second transistor T2 is electrically connected to the second node N2. The bias adjustment circuit 40 includes a third transistor T3, a gate of the third transistor T3 is electrically connected to the first scanning signal terminal S1, a first terminal of the third transistor T3 is electrically connected to the reference voltage terminal Vref, and a second terminal of the third transistor T3 is electrically connected to the second node N2. The light-emitting control circuit 20 includes a first light-emitting control circuit 21 and a second light-emitting control circuit 22. The first light-emitting control circuit 21 includes a fifth transistor T5, a gate of the fifth transistor T5 is electrically connected to the first light-emitting signal terminal E, a first terminal of the fifth transistor T5 is electrically connected to the third node N3, and a second terminal of the fifth transistor T5 is electrically connected to the light-emitting element OL. The second light-emitting control circuit 22 includes a sixth transistor T6, a gate of the sixth transistor T6 is electrically connected to the second light-emitting signal terminal E2, a first terminal of the sixth transistor T6 is electrically connected to the power signal terminal PV, and a second terminal of the sixth transistor T6 is electrically connected to the second node N2. The control terminal of the light-emitting element resetting circuit 50 is electrically connected to the fourth scanning signal terminal S4, a first terminal of the light-emitting element resetting circuit 50 is electrically connected to the reference voltage terminal Vref, a second terminal of the light-emitting element resetting circuit 50 is electrically connected to the fourth node N4, and the fourth node N4 is electrically connected to the light-emitting element OL.

In the present embodiment, the first terminal of the third transistor T3 in the bias adjustment circuit 40 is electrically connected to the reference voltage terminal Vref, that is, the reference voltage terminal Vref is reused as a bias adjustment signal terminal, which can reduce the number of signal ports that drive the pixel circuit to work, thereby simplifying the driving method of the pixel circuit. When the pixel circuit is applied in the display panel, the number of signal lines provided in the panel can be reduced, which saves space.

In an embodiment, the driving transistors Tm in the above pixel circuit structure are all shown as P-type transistors, and the transistors of the data writing circuit 10, the light-emitting control circuit 20, the bias adjustment circuit 40 and the light-emitting element resetting circuit 50 are all P-type transistors, and the transistor of the threshold compensation circuit 30 is an N-type transistor. The drawings of the foregoing embodiments are only schematic representations, and the embodiments of the present disclosure do not limit the types of the transistors of the pixel circuit.

An embodiment of the present disclosure also provides a display panel, the display panel further includes multiple light-emitting elements and multiple pixel circuits, the light-emitting element is electrically connected to the pixel circuit, and the pixel circuit is any one of the pixel circuits provided in the above embodiments.

In an embodiment, the display panel includes a plurality of sub-pixels, and the sub-pixel includes a light-emitting element and the pixel circuit, one of the plurality of pixel circuits of one of the plurality of sub-pixels having a first color is connected to a different bias adjustment signal terminal from the bias adjustment signal terminal connected to one of the plurality of pixel circuit of one of the plurality of sub-pixels having a second color, wherein the first color is different from the second color. In the display panel, a red sub-pixel includes a red light-emitting element, a green sub-pixel includes a green light-emitting element, and a blue sub-pixel includes a blue light-emitting element. Light-emitting materials of the red light-emitting element, the green light-emitting element, and the blue light-emitting element are different, and when driving the light-emitting elements to emit light, driving currents supplied to the red light-emitting element, the green light-emitting element, and the blue light-emitting element are different. In applications, threshold drift of the driving transistors of the pixel circuits connected to different light-emitting elements due to the hysteresis effect are different. In the present embodiment, one of the plurality of pixel circuits of one of the plurality of sub-pixels having a first color is connected to a different bias adjustment signal terminal from the bias adjustment signal terminal connected to one of the plurality of pixel circuit of one of the plurality of sub-pixels having a second color, wherein the first color is different from the second color, which can perform bias adjustment on different bias adjustment signals according to the threshold drift conditions of the driving transistors in the pixel circuits of different sub-pixels due to the hysteresis effect, such that it can be achieved that bias adjustment at different degrees are performed on the driving transistors in the pixel circuits of different color sub-pixels, to ensure the accuracy of the bias adjustment on the driving transistors in the pixel circuits of different color sub-pixels.

Figure 6A:
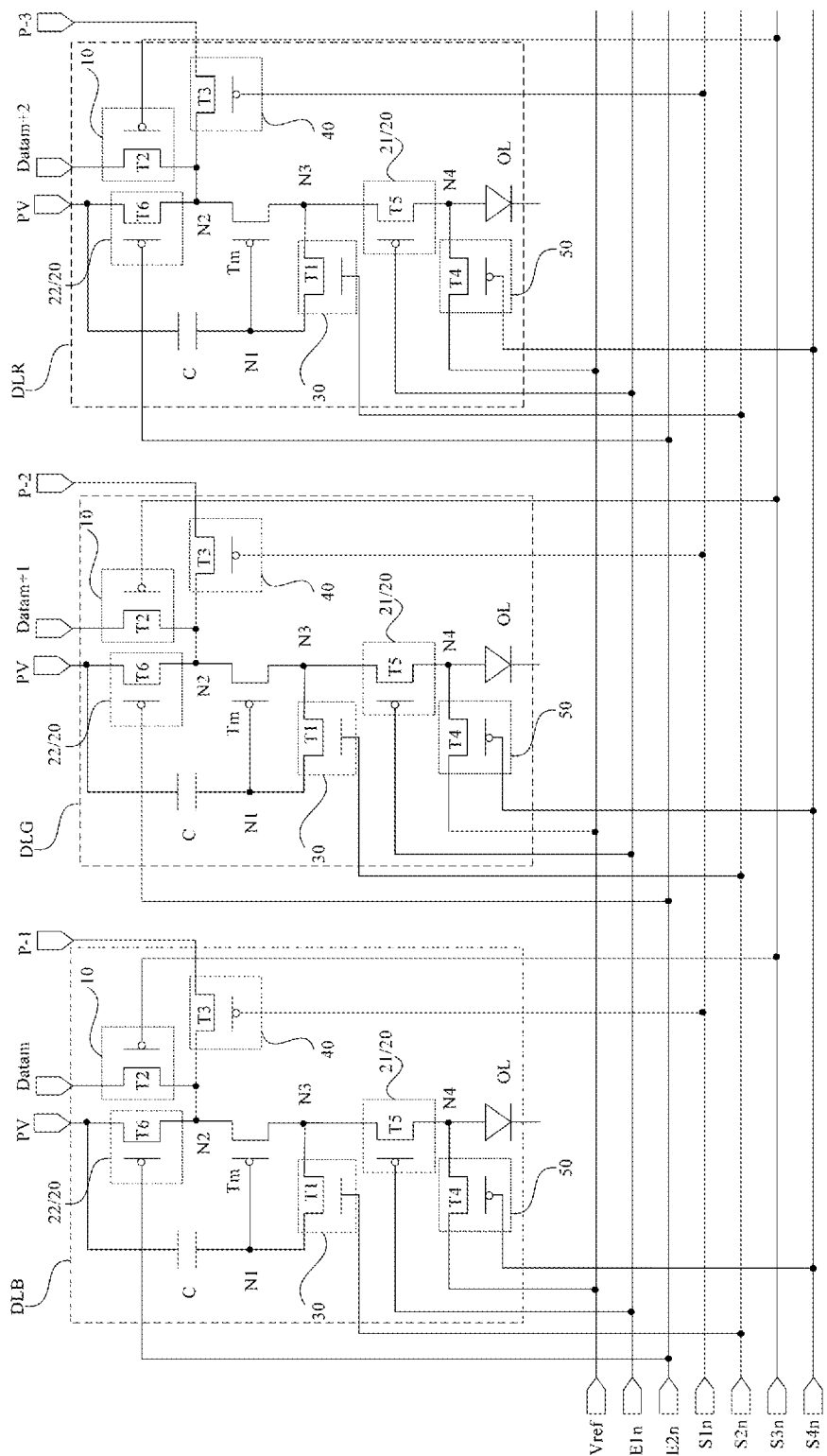
FIG. 6A is a schematic diagram of a display panel provided by an embodiment of the present disclosure.

In an embodiment, the multiple sub-pixels include red sub-pixels, green sub-pixels, and blue sub-pixels. FIG. 6A is a schematic diagram of a display panel provided by an embodiment of the present disclosure. As shown in FIG. 6A, only a case where one sub-pixel row includes sub-pixels of three colors—red, green, and blue—is exemplarily illustrated, the control terminals of the bias adjustment circuits 40 of the pixel circuits of the sub-pixels of the three colors are connected to the same first scanning signal terminal S1n, the control terminals of the threshold compensation circuits 30 of the pixel circuits of the sub-pixels of the three colors are connected to the same second scanning signal terminal S2n, the control terminals of the data writing circuits 10 of the pixel circuits of the sub-pixels of the three colors are connected to the same third scanning signal terminal S3n, the control terminals of the light-emitting element resetting circuits 50 of the pixel circuits of the sub-pixels of the three colors are connected to the same fourth scanning signal terminal S4n, the control terminals of the first light-emitting control circuits 21 of the pixel circuits of the sub-pixels of the three colors are connected to the same first light-emitting signal terminal E1n, the control terminals of the second light-emitting control circuits 22 of the pixel circuits of the sub-pixels of the three colors are connected to the same second light-emitting signal terminal E2n, and the first terminals of the data writing circuits 10 of the pixel circuits of the sub-pixels of the three colors are respectively connected to data signal terminals Datam, Datam+1, and Datam+2. A pixel circuit DLB of the blue sub-pixel is connected to the first bias adjustment signal terminal P-1, a pixel circuit DLG of the green sub-pixel is connected to the second bias adjustment signal terminal P-2, and a pixel circuit DLR of the red sub-pixel is connected to the third bias adjustment signal terminal P-3; a voltage value of a signal provided by the first bias adjustment signal terminal P-1 is larger than a voltage value of a signal provided by the second bias adjustment signal terminal P-2, and a voltage value of a signal provided by the first bias adjustment signal terminal P-1 is larger than a voltage value of a signal provided by the third bias adjustment signal terminal P-3. In the display panel, the blue light-emitting element has a short lifespan, and a driving current provided by the pixel circuit to the blue light-emitting element is relatively large, then a potential of the first node in the pixel circuit of the blue sub-pixel is relatively low, and a voltage difference between the first node and the third node is relatively small, whereas the degree of the threshold deviation caused by the hysteresis effect of driving depends on a voltage difference between the gate and the drain of the driving transistor, then the degree of the threshold shift caused by the hysteresis effect of the driving transistor in the pixel circuit of the blue sub-pixel is the smallest. In the present embodiment, providing a bias adjustment signal having a relatively small voltage value to the bias adjustment signal terminal of the pixel circuit of the red sub-pixel and the bias adjustment signal terminal of the pixel circuit of the green sub-pixel can adjust bias states of the driving transistor of the pixel circuit of the red sub-pixel and the driving transistor of the pixel circuit of the green sub-pixel to a relatively large extent, to delay the threshold drift caused by the hysteresis effect of the driving transistor to a relatively large extent; providing a bias adjustment signal having a relatively large voltage value to the bias adjustment signal terminal of the pixel circuit of the blue sub-pixel adjusts a bias state of the driving transistor in the pixel circuit of the blue sub-pixel to a relatively small extent, to ensure, as possible, the accuracy of the bias adjustment of the driving transistors in the pixel circuits of the sub-pixels of different colors.

In an embodiment, the voltage value of the signal provided by the second bias adjustment signal terminal is the same as the voltage value of the signal provided by the third bias adjustment signal terminal. The threshold shift condition of the driving transistor in the pixel circuit of the red sub-pixel is not much different from the threshold shift condition of the driving transistor in the pixel circuit of the green sub-pixel, and performing bias adjustment on the driving transistor in the pixel circuit of the red sub-pixel and the driving transistor in the pixel circuit of the green sub-pixel by the same voltage value can simply circuit wiring in the display panel while delaying the threshold drift of the driving transistor due to the hysteresis effect.

In another embodiment, in a same row, one of the plurality of pixel circuits of one of the plurality of sub-pixels having a first color is connected to a different first scanning signal terminal from a first scanning signal terminal connected to one of the plurality of pixel circuit of one of the plurality of sub-pixels having a second color, wherein the first color is different from the second color. In applications, the driving transistors in the pixel circuits connected to different light-emitting elements have different threshold drift conditions due to the hysteresis effect. This embodiment can, based on the threshold drift conditions of the driving transistors in the pixel circuits of different sub-pixels due to the hysteresis effect, set different bias adjustment control signal terminals (that is, corresponding to the first scanning signal terminal in the pixel circuit), and by adjusting the time of outputting the effective level signal from the bias adjustment control signal terminal in one driving period, bias adjustment of different degrees can be performed on the driving transistors in the pixel circuits of different color sub-pixels to ensure the accuracy of the bias adjustment on the driving transistors in the pixel circuits of different color sub-pixels.

In an embodiment, when driving the display panel to display an image frame, an effective level is provided by a first scanning signal terminal connected to the pixel circuit of one of the blue sub-pixels for a first period, the effective level is provided by a first scanning signal terminal connected to the pixel circuit of at least one of the red sub-pixels or the green sub-pixels for a second period, the one of the blue sub-pixels and the at least one of the red sub-pixels or the green sub-pixels are located in a same row, and the first period is shorter than the second period. It is configured that the time for the first scanning signal terminal connected to the pixel circuit of the red sub-pixel to provide an effective level signal is longer than the time for the first scanning signal terminal connected to the pixel circuit of the blue sub-pixel to provide an effective level signal, and the time for the first scanning signal terminal connected to the pixel circuit of the green sub-pixel to provide an effective level signal is longer than the time for the first scanning signal terminal connected to the pixel circuit of the blue sub-pixel to provide an effective level signal. The present embodiment can adjust the bias states of the driving transistors of the pixel circuit of the red sub-pixel and the pixel circuit of the green sub-pixel to a relatively large extent and can adjust the bias state of the driving transistor of the pixel circuit of the blue sub-pixel to a smaller extent, to ensure, as possible, the accuracy of the bias adjustment of the driving transistors in the pixel circuits of the sub-pixels of different colors.

Based on the same inventive concept, an embodiment of the present disclosure also provides a driving method of a display panel, which can be suitable for driving the display panel provided by the embodiment of the present disclosure. The display panel includes the pixel circuit provided by the embodiment of the present disclosure, and reference can be made to the drawings in the above pixel circuit embodiment. As shown in FIG. 1, the pixel circuit includes a driving transistor Tm, a data writing circuit 10, a light-emitting control circuit 20, a threshold compensation circuit 30, and a bias adjustment circuit 40. The data writing circuit 10 is configured to provide a data signal to the driving transistor Tm, the light-emitting control circuit 20 is connected in series with the driving transistor Tm and the light-emitting element OL and configured to control whether a driving current flows through the light-emitting element OL. The threshold compensation circuit 30 is connected in series between a control terminal of the driving transistor Tm and a second terminal of the driving transistor Tm and configured to detect and self-compensate deviation of a threshold voltage of the driving transistor Tm. A gate of the driving transistor Tm is electrically connected to a first node N1, a first terminal of the driving transistor Tm is electrically connected to a second node N2, and a second terminal of the driving transistor Tm is electrically connected to a third node N3. The driving transistor Tm is configured to generate a driving current.

Figure 6B:
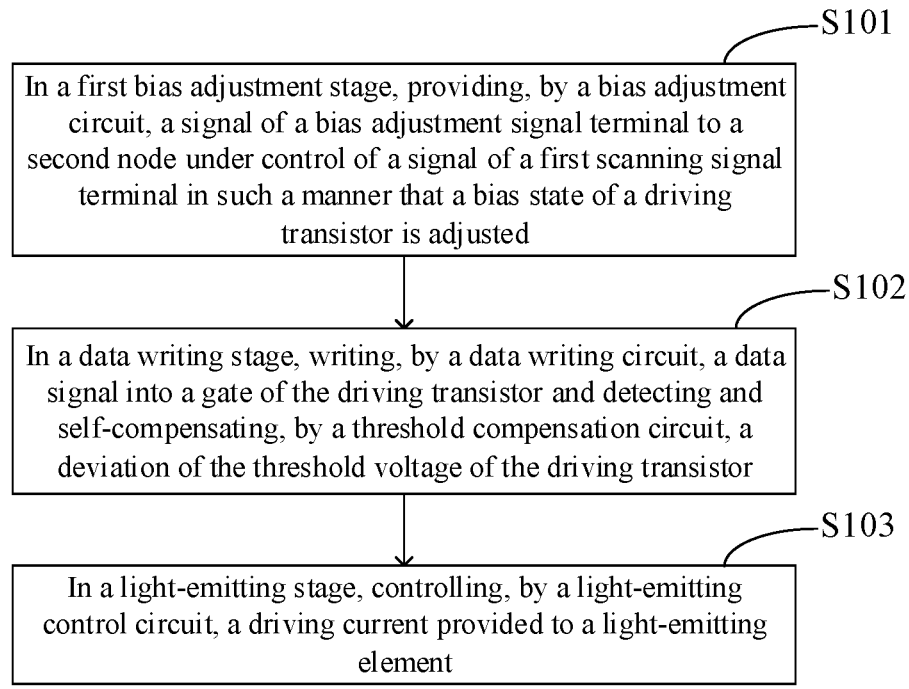
FIG. 6B is a flowchart of a driving method of a display panel provided by an embodiment of the present disclosure.

FIG. 6B is a flowchart of a driving method of a display panel according to an embodiment of the present disclosure. In an embodiment, as shown in FIG. 6B, a driving period of the pixel circuit of the display panel includes a first bias adjustment stage, a data writing stage, and a light-emitting stage. The driving method includes steps S101, S102 and S103.

At step S101, in the first bias adjustment stage, the bias adjustment circuit 40 provides a signal of the bias adjustment signal terminal P to the second node N2 under control of a signal of the first scanning signal terminal S1 in such a manner that a bias state of the driving transistor Tm is adjusted.

At step S102, in the data writing stage, the data writing circuit 10 writes the data signal to the gate of the driving transistor Tm, and the threshold compensation circuit 30 detects and self-compensates the deviation of the threshold voltage of the driving transistor Tm.

At step S103, in the light-emitting stage, the light-emitting control circuit 20 controls a driving current provided to the light-emitting element OL.

In the driving method provided by the present embodiment, the first bias adjustment stage is set during the driving period of the pixel circuit in such a manner that the bias state of the driving transistor Tm is adjusted, which can improve the problem of threshold drift caused by the hysteresis effect of the driving transistor, and improve the influence of the hysteresis effect of the driving transistor on the display effect. In addition, the bias adjustment stage and the data writing stage are independent from each other, and the working logic of the pixel circuit is relatively simple.

In an embodiment, the pixel circuit of the display panel further includes a light-emitting element resetting circuit, a structure of the pixel circuit can refer to FIG. 3, FIG. 4, or FIG. 5, a control terminal of the light-emitting element resetting circuit 50 is electrically connected to the fourth scanning signal terminal S4, a first terminal of the light-emitting element resetting circuit 50 is electrically connected to the reference voltage terminal Vref, and a second terminal of the light-emitting element resetting circuit 50 is electrically connected to the anode of the light-emitting element OL. The driving method provided by the embodiment of the present disclosure further includes: in at least one of the first bias adjustment stage of step S101 and the data writing stage of step S102, the light-emitting element resetting circuit 50 providing the signal of the reference voltage terminal Vref to the light-emitting element OL under the control of the signal of the fourth scanning signal terminal S4 to reset the light-emitting element OL.

In the present embodiment, the light-emitting element is reset in the first bias adjustment stage and/or the data writing stage, and there is no need to add an additional stage for resetting the light-emitting element in the driving period, such that the time of the non-light-emitting stage in the pixel driving period can be shortened, which shortens the time of a complete driving period of the pixel circuit and improves the response time of the light-emitting element of the display panel. In addition, when the pixel circuit is working in the bias adjustment stage or the data writing stage, the coupling effect in the pixel circuit structure may cause the electrode potential of the light-emitting element OL to rise, which may further cause undesired light-emission of the light-emitting element OL. In the present embodiment, in the bias adjustment stage and/or the data writing stage, the light-emitting element OL is reset at the same time, which can avoid light-emission of the light-emitting element OL.

Figure 7:
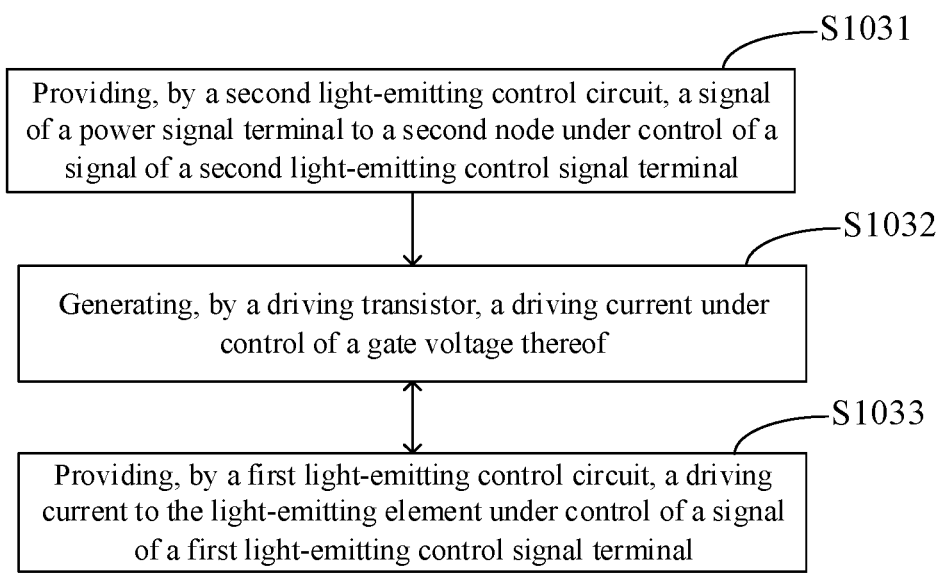
FIG. 7 is a flowchart of a driving method in a light-emitting stage provided by an embodiment of the present disclosure.

In an embodiment, the pixel circuit in the display panel further includes a first light-emitting control circuit and a second light-emitting control circuit, and a structure of the pixel circuit can refer to FIGS. 3 to 5 described above. FIG. 7 is a flowchart of the light-emitting stage of the driving method provided by an embodiment of the present disclosure. In an embodiment, as shown in FIG. 7, the step S103 at which the light-emitting control circuit 20 controls the driving current provided to the light-emitting element OL in the light-emitting stage includes steps S1031, S1032 and S1033.

At step S1031, the second light-emitting control circuit 22 provides the signal of the power signal terminal PV to the second node N2 under the control of the signal of the second light-emitting control signal terminal S2. In an embodiment, the second light-emitting control circuit 22 includes a sixth transistor T6, a gate of the sixth transistor T6 is electrically connected to the second light-emitting signal terminal E2, a first terminal of the sixth transistor T6 is electrically connected to the power signal terminal PV, and a second terminal of the sixth transistor T6 is electrically connected to the second node N2. The second light-emitting control circuit 22 is controlled by the signal provided by the second light-emitting control signal terminal S2, and when the second light-emitting control signal terminal S2 provides an effective level signal, the first terminal and the second terminal of the sixth transistor T6 is controlled to be conducted with each other, to provide the signal of the power signal terminal PV to the second node N2.

At step S1032, the driving transistor Tm generates a driving current under the control of its gate voltage.

At step S1033, the first terminal and the second terminal of the first light-emitting control circuit 21 are conducted with each other under the control of the signal of the first light-emitting control signal terminal S1, to provide the driving current to the light-emitting element OL. In an embodiment, the first light-emitting control circuit 21 includes a fifth transistor T5, a gate of the fifth transistor T5 is electrically connected to the first light-emitting signal terminal E1, a first terminal of the fifth transistor T5 is electrically connected to the third node N3, and a second terminal of the fifth transistor T5 is electrically connected to the light-emitting element OL. The first light-emitting control circuit 21 is controlled by the signal provided by the first light-emitting control signal terminal S, and when the first light-emitting control signal terminal S1 provides an effective level signal, the first terminal and the second terminal of the fifth transistor T5 are controlled to be conducted to provide the driving current to the light-emitting element OL.

In the light-emitting stage, the first light-emitting control circuit 21 and the second light-emitting control circuit 22 are controlled by different light-emitting signal terminals, and in the driving period of the pixel circuit, it can be achieved that the first light-emitting control circuit 21 and the second light-emitting control circuit 22 are separately controlled, which reuses the first light-emitting control circuit 21 or the second light-emitting control circuit 22 in other working stages, and can save the space occupied by the circuits of the pixel circuit structure and simplify the circuit structure. In an embodiment of the present disclosure, the first light-emitting control circuit can be reused in the stage of resetting the gate of the driving transistor, and this implementation will be described in following embodiments.

Figure 8:
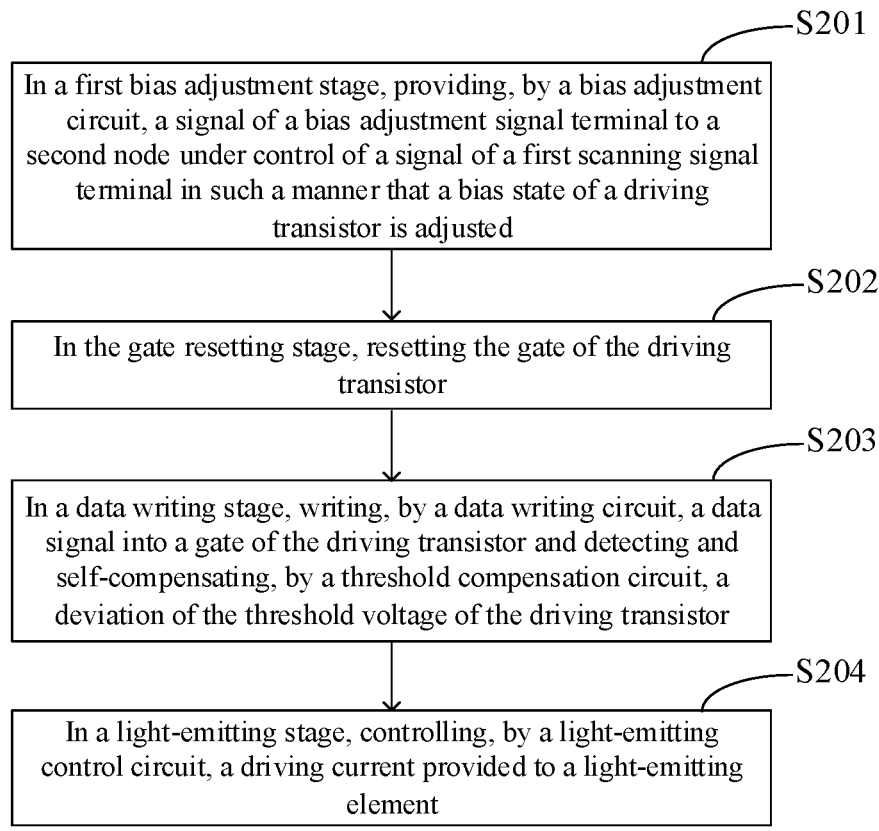
FIG. 8 is a flowchart of a driving method of a display panel provided by another embodiment of the present disclosure.

FIG. 8 is another flowchart of a driving method of a display panel provided by an embodiment of the present disclosure. In an embodiment, as shown in FIG. 8, the driving period of the pixel driving circuit includes steps S201, S202, S203, and S204.

At step S201, in the first bias adjustment stage, the bias adjustment circuit 40 provides the signal of the bias adjustment signal terminal P to the second node N2 under the control of the signal of the first scanning signal terminal S1 in such a manner that the bias state of the driving transistor Tm is adjusted. In an embodiment, the bias adjustment circuit 40 includes a third transistor T3, a gate of the third transistor T3 is electrically connected to the first scanning signal terminal S, a first terminal of the third transistor T3 is electrically connected to the bias adjustment signal terminal P, and a second terminal of the third transistor T3 is electrically connected to the second node N2. When the first scanning signal terminal S1 provides an effective level signal, the first terminal and the second terminal of the third transistor T3 are controlled to be conducted, to provide the signal of the bias adjustment signal terminal P to the second node N2.

At step S202, in the gate resetting stage, the gate of the driving transistor Tm is reset.

At step S203, in the data writing stage, the data writing circuit 10 writes the data signal into the gate of the driving transistor Tm, and the threshold compensation circuit 30 detects and self-compensates the deviation of the threshold voltage of the driving transistor Tm. In an embodiment, the threshold compensation circuit 30 includes a first transistor T1, a control terminal of the first transistor T1 is electrically connected to the second scanning signal terminal S2, a first terminal of the first transistor T1 is electrically connected to the third node N3, and a second terminal of the first transistor T1 is electrically connected to the first node N2.

The data writing circuit 10 includes a second transistor T2, a control terminal of the second transistor T2 is electrically connected to the third scanning signal terminal S3, a first terminal of the second transistor T2 is electrically connected to the data signal terminal Data, and a second terminal of the second transistor T2 is electrically connected to the second node N2. When the third scanning signal terminal S3 provides an effective level signal, the first terminal and the second terminal of the second transistor T2 are controlled to be conducted, to write the signal of the data signal terminal Data into the second node N2. The second scanning signal terminal S2 provides an effective level signal, to control the first terminal and the second terminal of the first transistor T1 to be conducted with each other, in this way, the gate and the second terminal of the driving transistor Tm are conducted with each other to compensate the threshold voltage of the driving transistor Tm during the data writing stage.

At step S204, in the light-emitting stage, the light-emitting control circuit 20 controls the driving current provided to the light-emitting element OL. In an embodiment, the light-emitting control circuit includes a first light-emitting control circuit and a second light-emitting control circuit, and the working process of the light-emitting control circuit in the light-emitting stage can refer to the description in the above-mentioned embodiment of FIG. 7, which will not be repeated herein.

The driving method provided by the present embodiment resets the gate of the driving transistor before the data writing stage to ensure the accuracy of writing signals to the gate of the driving transistor.

Figure 9:
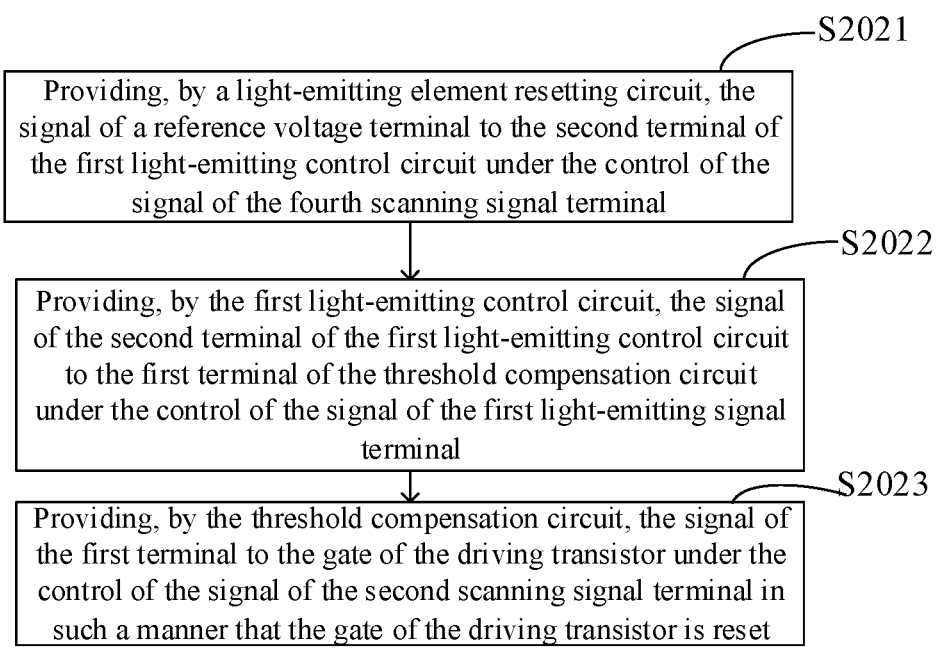
FIG. 9 is a flowchart of a driving method in a gate resetting stage provided by an embodiment of the present disclosure.

In an embodiment, the display panel provided in the embodiment of the present disclosure includes the pixel circuit as shown in the embodiment of FIG. 4 or FIG. 5, the pixel circuit includes a threshold compensation circuit 30, a first light-emitting control circuit 21 and a light-emitting element resetting circuit 50, and the threshold compensation circuit 30, the first light-emitting control circuit 21 and the light-emitting element resetting circuit 50 are reused as a gate resetting circuit. FIG. 9 is a flowchart of the gate resetting stage of the driving method provided by the embodiment of the present disclosure. In an embodiment, as shown in FIG. 9, the gate resetting stage of step S202, in which the gate of the driving transistor Tm is reset, includes steps S2021, S2022, and S2023.

At step S2021, the light-emitting element resetting circuit 50 provides the signal of the reference voltage terminal Vref to the second terminal of the first light-emitting control circuit 21 under the control of the signal of the fourth scanning signal terminal S4. In an embodiment, the light-emitting element resetting circuit 50 includes a fourth transistor T4, a gate of the fourth transistor T4 is electrically connected to the fourth scanning signal terminal S4, a first terminal of the fourth transistor T4 is electrically connected to the reference voltage terminal Vref, and a second terminal of the fourth transistor T4 is electrically connected to the fourth node N4. When the fourth scanning signal terminal S4 provides an effective level signal, the first terminal and the second terminal of the fourth transistor T4 are controlled to be conducted with each other, to provide the signal of the reference voltage terminal Vref to the fourth node N4.

At step S2022, the first light-emitting control circuit 21, under the control of the signal from the first light-emitting signal terminal E1, provides the signal of the second terminal thereof to the first terminal of the threshold compensation circuit 30. In an embodiment, the first light-emitting control circuit 21 includes a fifth transistor T5, a gate of the fifth transistor T5 is electrically connected to the first light-emitting signal terminal E1, a first terminal of the fifth transistor T5 is electrically connected to the third node N3, and a second terminal of the fifth transistor T5 is electrically connected to the fourth node N4. The first light-emitting control signal terminal S1 provides an effective level signal to control the first terminal and the second terminal of the fifth transistor T5 to be conducted, to provide the signal of the fourth node N4 to the first terminal of the threshold compensation circuit 30, that is, to provide the signal provided by the reference voltage terminal Vref to the first terminal of the threshold compensation circuit 30.

At step S2023, the threshold compensation circuit 30, under the control of the signal of the second scanning signal terminal S2, provides the signal of the first terminal thereof to the gate of the driving transistor Tm, to reset the gate of the driving transistor Tm. In an embodiment, the threshold compensation circuit 30 includes a first transistor T1, a control terminal of the first transistor T1 is electrically connected to the second scanning signal terminal S2, a first terminal of the first transistor T1 is electrically connected to the third node N3, and a second terminal of the first transistor T1 is electrically connected to the first node N2. The second scanning signal terminal S2 provides an effective level signal to control the first terminal and the second terminal of the first transistor T1 to be conducted, the first terminal of the first transistor T1 is also the first terminal of the threshold compensation circuit 30, thus, the signal provided by the reference voltage terminal Vref is provided to the gate of the driving transistor Tm, to reset the gate of the driving transistor Tm.

The circuit of the present embodiment is reused as a gate resetting circuit, and no additional gate resetting circuit is required, which simplifies the circuit structure of the pixel circuit.

In an embodiment, the driving method provided by the embodiment of the present disclosure further includes a gate resetting stage in step S202, the light-emitting element resetting circuit 50 provides the signal of the reference voltage terminal Vref to the light-emitting element OL under the control of the signal of the fourth scanning signal terminal S4, to reset the light-emitting element OL. In an embodiment, the light-emitting element resetting circuit 50 includes a fourth transistor T4, a gate of the fourth transistor T4 is electrically connected to the fourth scanning signal terminal S4, a first terminal of the fourth transistor T4 is electrically connected to the reference voltage terminal Vref, a second terminal of the fourth transistor T4 is electrically connected to the fourth node N4, and the light-emitting element OL is electrically connected to the fourth node N4. An effective level signal is provided at the fourth scanning signal terminal S4, to control the first terminal and the second terminal of the fourth transistor T4 to be conducted, to provide the signal of the reference voltage terminal Vref to the fourth node N4, so as to provide the signal of the reference voltage terminal Vref to the light-emitting element OL, to reset the light-emitting element OL. In the gate resetting stage, coupling capacitance will be generated in the pixel circuit, which will cause the electrode potential of the light-emitting element OL to rise, which in turn causes undesired light-emission of the light-emitting element OL, while the embodiment of the present disclosure, through resetting the light-emitting element OL during the gate resetting stage, can avoid the undesired light-emission of the light-emitting element OL to affect the display effect.

Figure 10:
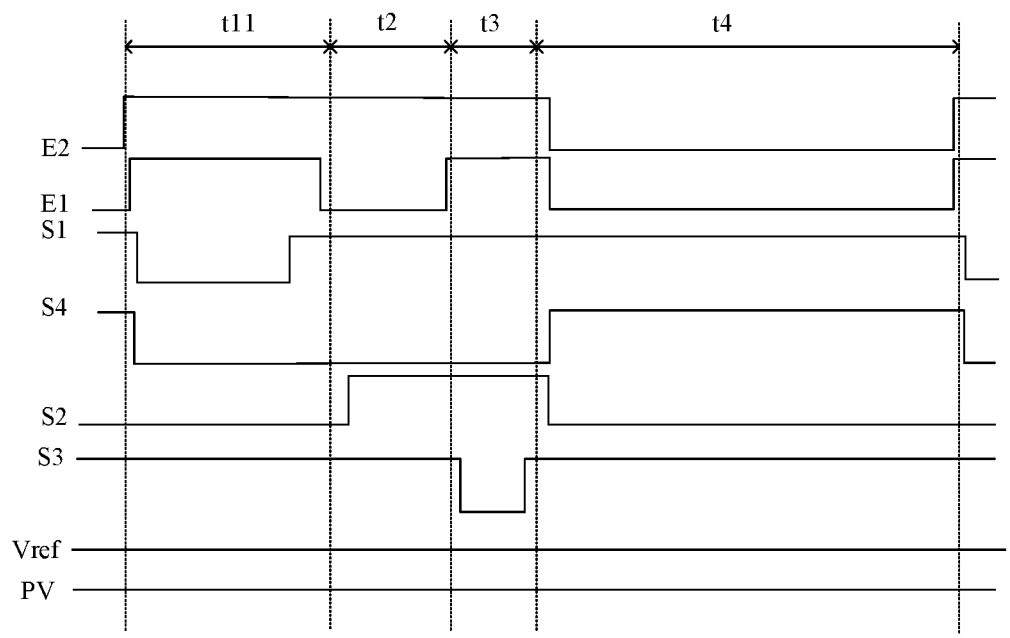
FIG. 10 is a timing diagram of a pixel circuit of a display panel provided by an embodiment of the present disclosure.

FIG. 10 is a timing diagram of a pixel circuit in a display panel provided by an embodiment of the present disclosure. FIG. 10 can be understood with reference to the pixel circuit structure in the embodiment of FIG. 4 or FIG. 5 described above. A case is taken for illustration where the driving transistor Tm, and the transistors in the data writing circuit 10, the light-emitting control circuit 20, the bias adjustment circuit 40, and the light-emitting element resetting circuit 50 are all P-type transistors, and the transistor in the threshold compensation circuit 30 is an N-type transistor. The threshold compensation circuit 30 includes a first transistor T1, a control terminal of the first transistor T1 is electrically connected to the second scanning signal terminal S2, a first terminal of the first transistor T1 is electrically connected to the third node N3, and a second terminal of the first transistor T1 is electrically connected to the first node N2. The data writing circuit 10 includes a second transistor T2, a control terminal of the second transistor T2 is electrically connected to the third scanning signal terminal S3, a first terminal of the second transistor T2 is electrically connected to the data signal terminal Data, and a second terminal of the second transistor T2 is electrically connected to the second node N2. The bias adjustment circuit 40 includes a third transistor T3, a gate of the third transistor T3 is electrically connected to the first scanning signal terminal S, a first terminal of the third transistor T3 is electrically connected to the bias adjustment signal terminal (indicated as P in FIG. 4 and as Vref in FIG. 5), and a second terminal of the third transistor T3 is electrically connected to the second node N2. The light-emitting element resetting circuit 50 includes a fourth transistor T4, a gate of the fourth transistor T4 is electrically connected to the fourth scanning signal terminal S4, a first terminal of the fourth transistor T4 is electrically connected to the reference voltage terminal Vref, and a second terminal of the fourth transistor T4 is electrically connected to the fourth node N4. The light-emitting control circuit 20 includes a first light-emitting control circuit 21 and a second light-emitting control circuit 22, the first light-emitting control circuit 21 includes a fifth transistor T5, a gate of the fifth transistor T5 is electrically connected to the first light-emitting signal terminal E1, a first terminal of the fifth transistor T5 is electrically connected to the third node N3, a second terminal of the fifth transistor T5 is electrically connected to the fourth node N4, and the light-emitting element OL is electrically connected to the fourth node N4. The second light-emitting control circuit 22 includes a sixth transistor T6, a gate of the sixth transistor T6 is electrically connected to the second light-emitting signal terminal E2, a first terminal of the sixth transistor T6 is electrically connected to the power signal terminal PV, and a second terminal of the sixth transistor T6 is electrically connected to the second node N2. As shown in FIG. 10, the driving period of the pixel circuit includes a first bias adjustment stage t11, a gate resetting stage t2, a data writing stage t3, and a light-emitting stage t4.

In the first bias adjustment stage t11, the first scanning signal terminal S provides an effective level signal, to control the first terminal and the second terminal of the control bias adjustment circuit 40 to be conducted, to provide the signal of the bias adjusting signal terminal P to the second node N2, in order to adjust the bias state of the driving transistor Tm. In an embodiment, the bias adjustment circuit 40 includes a third transistor T3, and the first scanning signal terminal S1 provides an effective level signal to control the first terminal and the second terminal of the third transistor T3 to be conducted with each other to provide the signal of the bias adjustment signal terminal P to the second node N2. In the embodiment of FIG. 5, the reference voltage terminal Vref is reused as a bias adjustment signal terminal. At this stage, the fourth scanning signal terminal S4 provides an effective level signal to control the first terminal and the second terminal of the light-emitting element resetting circuit 50 to be conducted to provide the signal of the reference voltage terminal Vref to the fourth node N4, and the light-emitting element OL is electrically connected to the fourth node N4, so that the light-emitting element OL is reset. In an embodiment, the light-emitting element resetting circuit 50 includes a fourth transistor T4, and the fourth scanning signal terminal S4 provides an effective level signal to control the first terminal and the second terminal of the fourth transistor T4 to be conducted with each other, to provide the signal of the reference voltage terminal Vref to the fourth node N4.

In the gate resetting stage t2, the fourth scanning signal terminal S4 provides an effective level signal to control the first terminal and the second terminal of the fourth transistor T4 to be conducted with each other, the first light-emitting signal terminal E1 provides an effective level signal to control the first terminal and the second terminal of the first light-emitting control circuit 21 to be conducted with each other, and the second scanning signal terminal S2 provides an effective level signal to control the first terminal and the second terminal of the threshold compensation circuit 30 to be conducted with each other, such that the signal of the reference voltage terminal Vref can be provided to the first node N1, to reset the gate of the driving transistor Tm. In an embodiment, the first light-emitting control circuit 21 includes a fifth transistor T5, the threshold compensation circuit 30 includes a first transistor T1, the first light-emitting signal terminal E1 provides an effective level signal to control the first terminal and the second terminal of the fifth transistor T5 to be conducted with each other, and the second scanning signal terminal S2 provides an effective level signal to control the first terminal and the second terminal of the first transistor T1 to be conducted with each other. At the same time, in this stage, the fourth scanning signal terminal S4 provides an effective level signal to control the first terminal and the second terminal of the fourth transistor T4 to be conducted with each other, and the light-emitting element OL can also be reset after the signal of the reference voltage terminal Vref is provided to the fourth node N4.

In the data writing stage t3, the third scanning signal terminal S3 provides an effective level signal to control the first terminal and the second terminal of the data writing circuit 10 to be conducted with each other, to write the signal of the data signal terminal Data into the second node N2. In an embodiment, the data writing circuit 10 includes a second transistor T2, the third scanning signal terminal S3 provides an effective level signal to control the first terminal and the second terminal of the second transistor T2 to be conducted, to write the signal of the data signal terminal Data into the second node N2; the driving transistor Tm makes the first terminal and the second terminal thereof conducted with each other under the control of the gate voltage thereof, to provide the voltage signal of the second node N2 to the third node N3; the second scanning signal terminal S2 provides an effective level signal to control the first terminal and the second terminal of the first transistor T1 to be conducted with each other, to provide the voltage signal of the third node N3 to the first node N1, that is, to cause the second terminal and the control terminal (the gate) of the driving transistor Tm to be conducted with each other, to write the data signal into the gate of the driving transistor Tm, and to detect and self-compensate the deviation of the threshold voltage of the driving transistor Tm at the same time. In addition, in this stage, the fourth scanning signal terminal S4 provides an effective level signal to control the first terminal and the second terminal of the fourth transistor T4 to be conducted with each other, to provide the signal of the reference voltage terminal Vref to the fourth node N4, to reset the light-emitting element OL.

In the light-emitting stage t4, the second light-emitting control signal terminal E2 provides an effective level signal to control the first terminal and the second terminal of the second light-emitting control circuit 22 to be conducted with each other, to provide the signal of the power signal terminal PV to the second node N2. In an embodiment, the second light-emitting control circuit 22 includes a sixth transistor T6, and the second light-emitting control signal terminal E2 provides an effective level signal to control the first terminal and the second terminal of the sixth transistor T6 to be conducted with each other, to provide the signal of the power signal terminal PV to the second node N2; the driving transistor Tm generates a driving current under the control of the potential of the first node N1, and the capacitor C can stabilize the potential of the first node N1 in this process; the first light-emitting control signal terminal E1 provides an effective level signal to control the first terminal and the second terminal of the fifth transistor T5 to be conducted with each other, thereby providing the driving current to the light-emitting element OL, so that the light-emitting element OL can emit light under the driving of the current.

In the present embodiment, the first bias adjustment stage is added before the gate resetting stage in order to adjust the bias state of the driving transistor, to improve the problem of the threshold drift caused by the hysteresis effect of the driving transistor, so as to improve the influence of the hysteresis effect of the driving transistor on the display effect. Resetting of the gate of the driving transistor is achieved through timing coordination of the first light-emitting control circuit, the threshold compensation circuit and the light-emitting element resetting circuit, and there is no need to add an additional gate resetting circuit, which can simplify the structure of the pixel circuit. In addition, in the present embodiment, the light-emitting element is continuously reset during the first bias adjustment stage, the gate resetting stage and the data write stage, and this can prevent the coupling effect in the circuit structure from causing the electrode potential of the light-emitting element to rise, thereby preventing the undesired light-emission of the light-emitting element from affecting the display effect.

Figure 11:
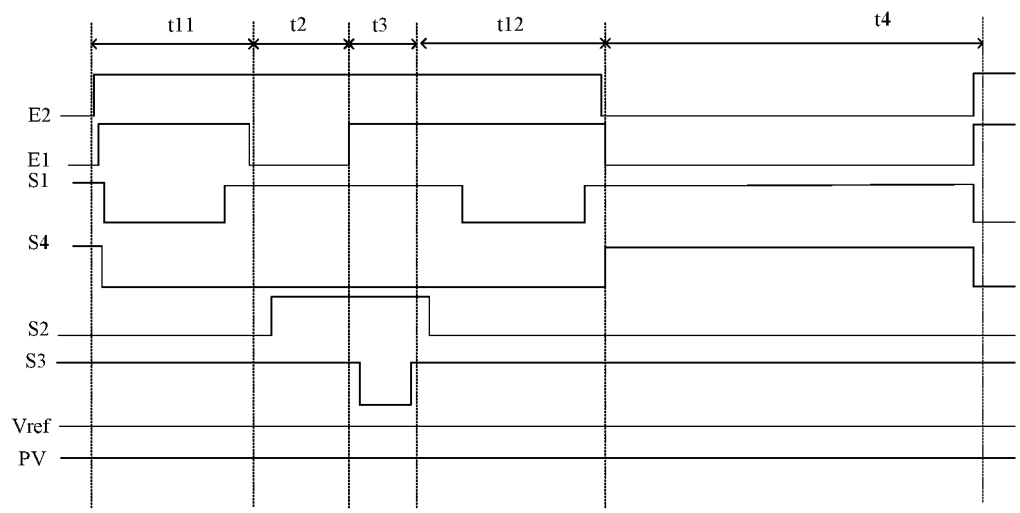
FIG. 11 is a timing diagram of a pixel circuit of a display panel provided by another embodiment of the present disclosure.

In an embodiment, the driving period of the pixel circuit of the display panel provided by the embodiment of the present disclosure includes two bias adjustment stages. FIG. 11 is another timing diagram of the pixel circuit in the display panel provided by the embodiment of the present disclosure. It can be understood with reference to the pixel circuit structure in the embodiment of FIG. 4 or FIG. 5 described above. As shown in FIG. 11, the driving period of the pixel circuit includes a first bias adjustment stage t1, a gate resetting stage t2, a data writing stage t3, a second bias adjustment stage t12, and a light-emitting stage t4. For the working processes in the first bias adjustment stage t11, the gate resetting stage t2, the data writing stage t3 and the light-emitting stage t4, reference can be made to the description in the embodiment of FIG. 10, which will not be repeated herein.

In the embodiment of FIG. 11, a second bias adjustment stage t12 is further provided between the data writing stage t3 and the light-emitting stage t4. In the second bias adjustment stage t12, the first scanning signal terminal S1 provides an effective level signal, to control the first terminal and the second terminal of the bias adjustment circuit 40 to be conducted, to provide the signal of the bias adjustment signal terminal P to the second node N2, in order to adjust the bias state of the driving transistor Tm. Specifically, the first scanning signal terminal S1 provides an effective level signal, to control the first terminal and the second terminal of the third transistor T3 to be conducted with each other, to provide the signal of the bias adjustment signal terminal P to the second node N2. Moreover, at this stage, the fourth scanning signal terminal S4 provides an effective level signal, to control the first terminal and the second terminal of the light-emitting element resetting circuit 50 to be conducted with each other, to provide the signal of the reference voltage terminal Vref to the fourth node N4, the light-emitting element OL is electrically connected to the fourth node N4, so as to reset the light-emitting element OL. In an embodiment, the fourth scanning signal terminal S4 provides an effective level signal to control the first terminal and the second terminal of the fourth transistor T4 to be conducted with each other, to provide the signal of the reference voltage terminal Vref to the fourth node N4.

In the present embodiment, the two bias adjustment stages are provided in the working cycle of the pixel circuit to increase the bias adjustment time of the driving transistor in the driving period, in order to improve the degree of improvement of the threshold voltage drift caused by the hysteresis effect caused by long-term working of the driving transistor in a forward bias state. Adding the second bias adjustment stage after the data writing stage can ensure accuracy of the threshold in an initial stage of subsequent light emission.

In an embodiment, the period of the first bias adjustment stage is longer than the period of the second bias adjustment stage. Referring to the illustrations of the structure diagram in FIG. 4 or FIG. 5 and the timing diagram in FIG. 10, the first bias adjustment stage t11 is arranged before the gate resetting stage t2 and the data writing stage t3, and in the first bias adjustment stage t1, the potential of the first node N1 is negative, a voltage difference between the first node N1 and the third node N3 is large at this stage. The second bias adjustment stage t12 is after the data writing stage t3, and in the second bias adjustment stage t12, the potential of the first node N1 is the written data voltage, then the voltage difference between the first node N1 and the third node N3 is relatively small, and an effect of reverse bias adjustment on the driving transistor Tm is better in the first bias adjustment stage 11 compared with that in the second bias adjustment stage t12. In the embodiment of the present disclosure, the period of the first bias adjustment stage is configured to be longer than the period of the second bias adjustment stage, and the time for setting a stage having a better bias adjustment effect within limited time is longer, such that a better bias adjustment effect can be achieved without changing the total time of one driving period of the pixel circuit.

In an embodiment, the ratio of the period of the first bias adjustment stage to the period of the second bias adjustment stage is greater than 1.3. By reasonably setting the period of the bias adjustment stage before and after the data writing stage, an effective bias adjustment on the driving transistor can be achieved while ensuring that the bias adjustment stage occupies a short time in the overall driving period, which shortens the driving period and increases the response speed.

In an embodiment, a voltage value of the signal provided by the bias adjustment signal terminal is smaller than −3V When the pixel circuit is working in the light-emitting stage, the driving transistor works in a forward bias state, the gate voltage of the driving transistor is larger than the drain voltage to generate a driving current, and the anode of the light-emitting element is connected to the drain of the driving transistor through a switching transistor (the fifth transistor in the first light-emitting control circuit in the embodiment of the present disclosure). When being in the bias adjustment stage, the bias adjustment circuit writes a voltage signal smaller than −3V to the second node to make the potential of the second node smaller than the potential of the third node, so as to reverse the source and the drain of the driving transistor, and the second node is the drain, while the third node becomes the source, and the driving transistor is reversely biased in such a manner that the bias state of the driving transistor is adjusted.

FIG. 12 is a flowchart of a driving method of a display panel according to an embodiment of the present disclosure. In an embodiment, as shown in FIG. 12, the driving method further includes step 301.

At step 301, a driving mode of the display panel is determined, and if the driving mode is a high-frequency driving mode, the pixel circuit is driven to execute steps performed in the data writing stage and the light-emitting stage (i.e., the pixel circuit is driven to operate in the bias adjustment stage, the data writing stage, and the light-emitting stage); and if the driving mode is a low-frequency driving mode, the pixel circuit is driven to execute steps performed in the first bias adjustment stage, the data writing stage, and the light-emitting stage, i.e., the pixel circuit is driven to operate in the bias adjustment stage, the data writing stage, and the light-emitting stage.

In related art, driving frequencies of the display panel include 15 Hz, 30 Hz, 40 Hz, 50 Hz, 60 Hz, 120 Hz, etc., and in order to meet needs of displaying different images while saving the power consumption of the display panel, the display panel is usually set with at least two driving modes with different frequency levels, and driving the display panel and displaying dynamic images at a relatively high frequency can improve the display effect. Driving the display panel and displaying static images at a relatively low frequency can reduce power consumption. In general, a frequency smaller than 60 Hz is defined as the low-frequency driving mode, and a frequency equal to or larger than 60 Hz is defined as the high-frequency driving mode. In the low-frequency driving mode, when the pixel circuit drives the light-emitting element to emit light, the period for the driving transistor to work in the forward bias state is longer, the threshold drift caused by the hysteresis effect of the driving transistor is more obvious, and the human eye is more likely to perceive image flickering. In the present embodiment, it is set that in the low-frequency driving mode, the pixel circuit executes steps performed in the bias adjustment stage (i.e., the pixel circuit operates in the bias adjustment stage), and the bias state of the driving transistor can be adjusted in the low-frequency driving mode, to improve the threshold drift caused by the hysteresis effect of the driving transistor. Moreover, in the high-frequency driving mode, the pixel circuit does not execute steps performed in the bias adjustment stage, and the driving manner of the pixel circuit in the high-frequency driving mode can be simplified.

FIG. 13 is a flowchart of a driving method of a display panel according to an embodiment of the present disclosure. In another embodiment, as shown in FIG. 13, the driving method further includes step 401.

At step 401, before driving the display panel to display an image frame, it is determined whether the image to be displayed is the same as a previous image frame, and when the image to be displayed is the same as the previous image frame, a process of driving the display panel to display the image frame includes: driving the pixel circuit to execute steps performed in the data writing stage and the light-emitting stage (i.e., driving the pixel circuit to operate in the data writing stage and the light-emitting stage); and when the image to be displayed is different from the previous image frame, the process of driving the display panel to display the image frame includes: driving the pixel circuit to execute steps performed in the first bias adjustment stage, the data writing stage, and the light-emitting stage (i.e., driving the pixel circuit to operate in the data writing stage and the light-emitting stage).

The present embodiment controls the pixel circuit to execute steps performed in the bias adjustment stage only when image switching is detected, which can improve the influence of the hysteresis effect of the driving transistor on the display effect and improve the display effect.

In an embodiment, when the driving mode is the low-frequency driving mode, the display process of an image frame includes a phase of data writing frame and a phase of holding frame. In the phase of data writing frame, the pixel circuit is driven to execute steps performed in the bias adjustment stage, the data writing stage and the light-emitting stage, i.e., the pixel circuit is driven to operate in the bias adjustment stage, the data writing stage and the light-emitting stage. In the phase of holding frame, the pixel circuit is driven to execute steps performed in the bias adjustment stage and the light-emitting stage, i.e., the pixel circuit is driven to operate in the bias adjustment stage and the light-emitting stage. The display process of an image can include one or more phases of holding frame, and a period of each of the phases of holding frame is the same as a period of a phase of data writing frame. FIG. 14 is a driving timing diagram of an alternative implementation manner of a driving method of a display panel provided by an embodiment of the present disclosure. As shown in FIG. 14, a timing diagram in the low-frequency driving mode is provided. Taking the driving frequency of 15 Hz as an example, a display period of one image frame is four times of a display period of one image frame when the driving frequency is 60 Hz. In the low-frequency driving mode provided by the embodiment of the present disclosure, the process of driving the display panel to display one image frame is divided into four frame sub-phases, i.e., Z1, Z2, Z3, and Z4. The first frame sub-phase Z1 is the phase of data writing frame, and the second frame sub-phase Z2, the third frame sub-phase Z3, and the fourth frame sub-phase Z4 each are the phase of holding frame, and there is no data writing process in the phase of holding frame. In the first frame sub-phase Z1, the pixel circuit is driven to sequentially execute steps performed in the first bias adjustment stage t1, the gate resetting stage t2, the data writing stage t3, the second bias adjustment stage t12, and the light-emitting stage t4. The working process of the pixel circuit in the first bias adjustment stage t11, the gate resetting stage t2, the data writing stage t3, the second bias adjustment stage t12, and the light-emitting stage t4 can refer to the description of the above-mentioned embodiments and will not be repeated herein. In the second frame sub-phase Z2, the third frame sub-phase Z3 and the fourth frame sub-phase Z4, signal timing of the first light-emitting control signal terminal E1 and signal timing of the second light-emitting control signal terminal E2 are controlled to be the same as timing of the first frame sub-phase Z1, and the pixel circuit can be driven to execute steps performed in the light-emitting stage t4. The signal timing of the second scanning signal terminal S2 and the third scanning signal terminal S3 in the non-light-emitting stage of the phase of holding frame is adjusted, to control both the second scanning signal terminal S2 and the third scanning signal terminal S3 to provide inactive level signals in the phase of holding frame, in order not to execute steps performed in the data writing stage and the gate resetting stage of the phase of holding frame, to avoid changing the potential of the first node N1 in the phase of holding frame. In an embodiment, as shown in FIG. 14, the signal timing of the fourth scanning signal terminal S4 in the phase of holding frame can be controlled to be the same as the signal timing thereof in the phase of data writing frame, in other words, the light-emitting element can be reset during the light-emitting element resetting stage of the phase of holding frame. In an embodiment, as shown in FIG. 14, the signal timing of the first scanning signal terminal S1 in the second frame sub-phase Z2, the third frame sub-phase Z3, and the fourth frame sub-phase Z4 are controlled to be the same as the signal timing thereof in the phase of data writing frame, then in the non-light-emitting stage of the phase of holding frame, the pixel circuit is driven to execute steps performed in the first bias adjustment stage t11 and the second bias adjustment stage t12, so as to increase the period for the bias adjustment of the driving transistor and improve the threshold drift caused by the hysteresis effect of the driving transistor.

In an embodiment, the period of the phase of holding frame is the same as the period of the phase of data writing frame, and the second scanning signal terminal and the third scanning signal terminal are both controlled to provide inactive level signals in the phase of holding frame in such a manner that the steps performed in the data writing stage and the gate resetting stage are not executed in the holding frame; and the fourth scanning signal terminal is controlled to continuously provide an inactive level signal in the phase of holding frame, and then the light-emitting element is not reset in the phase of holding frame. The driving circuit is controlled to execute steps performed in the first bias adjustment stage and the second bias adjustment stage in the phase of holding frame.

Figure 15:
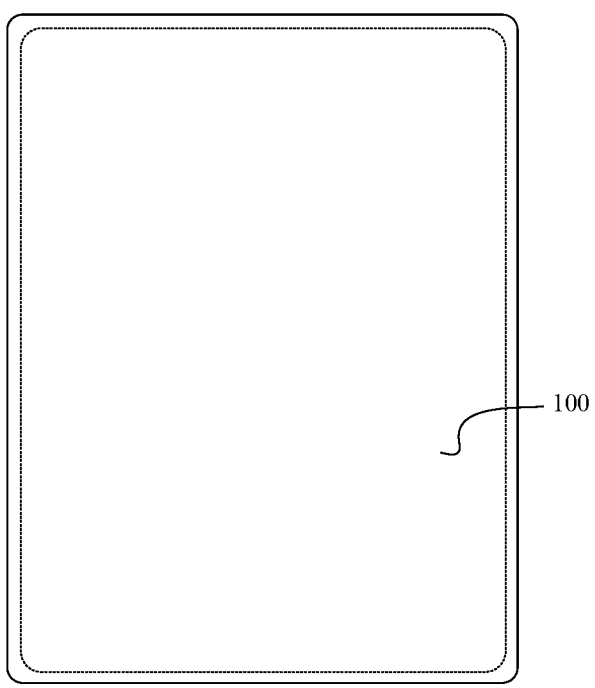
FIG. 15 is a schematic diagram of a display device provided by an embodiment of the present disclosure.

The embodiment of the present disclosure also provides a display device. FIG. 15 is a schematic diagram of the display device provided by an embodiment of the present disclosure. As shown in FIG. 15, the display device includes the display panel 100 provided by any one of embodiments of the present disclosure. The structure of the display panel has been described in the above embodiments and will not be repeated herein. The display device in the embodiment of the present disclosure can be any device with a display function, such as a mobile phone, a tablet computer, a notebook computer, an electronic paper book, a television, or a smart wearable product.

The above only illustrates some embodiments of the present disclosure and are not intended to limit the present disclosure. Any modifications, equivalents, improvements, etc., which are made within the spirit and principles of the present disclosure, should be included in the scope of the present disclosure.

Finally, it should be noted that the various embodiments above are only configured to illustrate the technical solutions of the present disclosure, not to limit them; although the present disclosure has been described in detail with reference to the various embodiments above, those skilled in the art should understand: they can still modify the technical solutions described in the various embodiments above, or equivalently replace some or all of the technical features; however, these modifications or replacements do not cause the essence of the corresponding technical solutions to deviate from the scope of the technical solutions of the embodiments of the present disclosure.

What is claimed is:

1. A display panel, comprising:
a plurality of pixel circuits,
wherein each of the plurality of pixel circuits comprises:
a driving transistor configured to generate a driving current, the driving transistor comprising a gate, a first terminal, and a second terminal;
a data writing circuit configured to provide a data signal to the driving transistor;
a light-emitting control circuit connected in series with the driving transistor and a light-emitting element, the light-emitting control circuit configured to control whether the driving current flows through the light-emitting element or not;
a threshold compensation circuit connected in series between the gate and the second terminal of the driving transistor, the threshold compensation circuit configured to detect and self-compensate deviation of a threshold voltage of the driving transistor, wherein the gate of the driving transistor is electrically connected to a first node, the first terminal of the driving transistor is electrically connected to a second node, the second terminal of the driving transistor is electrically connected to a third node, and the third node is connected to the light-emitting element through the light-emitting control circuit; and
a bias adjustment circuit comprising a control terminal electrically connected to a first scanning signal terminal, a first terminal electrically connected to a bias adjustment signal terminal, and a second terminal electrically connected to the second node, wherein the bias adjustment circuit is configured to provide a signal of the bias adjustment signal terminal to the second node under control of a signal of the first scanning signal terminal in such a manner that a bias state of the driving transistor is adjusted.

2. The display panel according to claim 1, wherein the threshold compensation circuit comprises a first transistor, and wherein the first transistor comprises a control terminal electrically connected to a second scanning signal terminal, a first terminal electrically connected to the third node, and a second terminal electrically connected to the first node.

3. The display panel according to claim 2, wherein the first transistor comprises an oxide semiconductor.

4. The display panel according to claim 3, wherein each of a channel length of the driving transistor, a channel length of a transistor of the data writing circuit, a channel length of a transistor of the light-emitting control circuit and a channel length of a transistor of the bias adjustment circuit is smaller than a channel length of the first transistor.

5. The display panel according to claim 1, wherein a width-to-length ratio of the driving transistor is smaller than each of a width-to-length ratio of a transistor of the data writing circuit, a width-to-length ratio of a transistor of the light-emitting control circuit, a width-to-length ratio of a transistor of the threshold compensation circuit, and a width-to-length ratio of a transistor of the bias adjustment circuit.

6. The display panel according to claim 1, wherein the data writing circuit comprises a second transistor, and wherein the second transistor comprises a control terminal electrically connected to a third scanning signal terminal, a first terminal electrically connected to a data signal terminal, and a second terminal electrically connected to the second node.

7. The display panel according to claim 1, wherein the bias adjustment circuit comprises a third transistor, and wherein the third transistor comprises a gate electrically connected to the first scanning signal terminal, a first terminal electrically connected to the bias adjustment signal terminal, and a second terminal electrically connected to the second node.

8. The display panel according to claim 1, further comprising:
a light-emitting element resetting circuit configured to reset the light-emitting element, wherein the light-emitting element resetting circuit comprises a control terminal electrically connected to a fourth scanning signal terminal, a first terminal electrically connected to a reference voltage terminal, and a second terminal electrically connected to the light-emitting element.

9. The display panel according to claim 8, wherein the light-emitting element resetting circuit comprises a fourth transistor, wherein the fourth transistor comprises a gate electrically connected to the fourth scanning signal terminal, a first terminal electrically connected to the reference voltage terminal, and a second terminal electrically connected to the light-emitting element.

10. The display panel according to claim 8, wherein the reference voltage terminal is reused as the bias adjustment signal terminal.

11. The display panel according to claim 8, wherein the light-emitting control circuit comprises:
a first light-emitting control circuit, wherein the first light-emitting control circuit comprises a control terminal electrically connected to a first light-emitting signal terminal, a first terminal electrically connected to the third node, and a second terminal electrically connected to the light-emitting element; and
a second light-emitting control circuit, wherein the second light-emitting control circuit comprises a control terminal electrically connected to a second light-emitting signal terminal, a first terminal electrically connected to a power signal terminal, and a second terminal electrically connected to the second node.

12. The display panel according to claim 11, wherein the threshold compensation circuit, the first light-emitting control circuit and the light-emitting element resetting circuit are reused as a gate resetting circuit configured to reset the gate of the driving transistor.

13. The display panel according to claim 12, wherein the threshold compensation circuit comprises a control terminal electrically connected to a second scanning signal terminal, and wherein the gate resetting circuit is configured to provide a reset signal to the gate of the driving transistor under control of a signal of the second scanning signal terminal, a signal of the fourth scanning signal terminal, and a signal of the first light-emitting signal terminal.

14. The display panel according to claim 11, wherein the first light-emitting control circuit comprises a fifth transistor, wherein the fifth transistor comprises a gate electrically connected to the first light-emitting signal terminal, a first terminal electrically connected to the third node, and a second terminal electrically connected to the light-emitting element; and
wherein the second light-emitting control circuit comprises a sixth transistor, wherein the sixth transistor comprises a gate electrically connected to the second light-emitting signal terminal, a first terminal electrically connected to the power signal terminal, and a second terminal electrically connected to the second node.

15. The display panel according to claim 1, comprising:
a plurality of sub-pixels, wherein each of the plurality of sub-pixels comprises a light-emitting element and one of the plurality of pixel circuits, wherein one of the plurality of pixel circuits of one of the plurality of sub-pixels having a first color is connected to a different bias adjustment signal terminal from the bias adjustment signal terminal connected to one of the plurality of pixel circuits of one of the plurality of sub-pixels having a second color, and wherein the first color is different from the second color.

16. The display panel according to claim 15, wherein the plurality of sub-pixels comprises a red sub-pixel, a green sub-pixel, and a blue sub-pixel, wherein at least one of the plurality of pixel circuits of the blue sub-pixel is connected to a first bias adjustment signal terminal, one of the plurality of pixel circuits of the green sub-pixel is connected to a second bias adjustment signal terminal, and one of the plurality of pixel circuits of the red sub-pixel is connected to a third bias adjustment signal terminal, and a voltage value of a signal provided by the first bias adjustment signal terminal is greater than a voltage value of a signal provided by the second bias adjustment signal terminal, and the voltage value of the signal provided by the first bias adjustment signal terminal is greater than a voltage value of a signal provided by the third bias adjustment signal terminal.

17. The display panel according to claim 1, comprising:
a plurality of sub-pixels, wherein each of the plurality of sub-pixels comprises a light-emitting element and one of the plurality of pixel circuits, wherein in a same row, one of the plurality of pixel circuits of one of the plurality of sub-pixels having a first color is connected to a different first scanning signal terminal from a first scanning signal terminal connected to one of the plurality of pixel circuit of one of the plurality of sub-pixels having a second color, wherein the first color is different from the second color.

18. The display panel according to claim 17, wherein the plurality of the sub-pixels comprises red sub-pixels, green sub-pixels, and blue sub-pixels, wherein when driving the display panel to display an image frame, an effective level is provided by a first scanning signal terminal connected to the pixel circuit of at least one of the blue sub-pixels for a first period, and the effective level is provided by a first scanning signal terminal connected to the pixel circuit of at least one of the red sub-pixels or the green sub-pixels for a second period, wherein the one of the blue sub-pixels and the at least one of the red sub-pixels or the green sub-pixels are located in a same row, and the first period is shorter than the second period.

19. A driving method of a display panel, wherein the display panel comprises a plurality of pixel circuits, wherein each of the plurality of pixel circuits comprises:
a driving transistor configured to generate a driving current and comprising a gate, a first terminal, and a second terminal;
a data writing circuit configured to provide a data signal to the driving transistor;
a light-emitting control circuit connected in series with the driving transistor and a light-emitting element, the light-emitting control circuit configured to control whether the driving current flows through the light-emitting element or not;
a threshold compensation circuit connected in series between the gate and the second terminal of the driving transistor, the threshold compensation circuit configured to detect and self-compensate deviation of a threshold voltage of the driving transistor, wherein a gate of the driving transistor is electrically connected to a first node, the first terminal of the driving transistor is electrically connected to a second node, the second terminal of the driving transistor is electrically connected to a third node, and the third node is connected to the light-emitting element through the light-emitting control circuit; and
a bias adjustment circuit comprising a control terminal electrically connected to a first scanning signal terminal, a first terminal electrically connected to a bias adjustment signal terminal, and a second terminal electrically connected to the second node, wherein the bias adjustment circuit is configured to provide a signal of the bias adjustment signal terminal to the second node under control of a signal of the first scanning signal terminal in such a manner that a bias state of the driving transistor is adjusted,
wherein a driving period of each of the plurality of pixel circuits comprises a bias adjustment stage, a data writing stage, and a light-emitting stage, wherein the bias adjustment stage comprises a first bias adjustment stage;
wherein the driving method comprises:
in the first bias adjustment stage, providing, by the bias adjustment circuit, the signal of the bias adjustment signal terminal to the second node under control of a signal of the first scanning signal terminal in such a manner that a bias state of the driving transistor is adjusted;
in the data writing stage, writing, by the data writing circuit, the data signal into the gate of the driving transistor and detecting and self-compensating, by the threshold compensation circuit, the deviation of the threshold voltage of the driving transistor; and
in the light-emitting stage, controlling, by the light-emitting control circuit, the driving current provided to the light-emitting element.

20. The driving method according to claim 19, wherein the bias adjustment stage further comprises a second bias adjustment stage between the data writing stage and the light-emitting stage;
wherein the driving method further comprises:
in the second bias adjustment stage, providing, by the bias adjustment circuit, the signal of the bias adjustment signal terminal to the second node under the control of the signal of the first scanning signal terminal in such a manner that the bias state of the driving transistor is adjusted.

21. The driving method according to claim 20, wherein a period of the first bias adjustment stage is longer than a period of the second bias adjustment stage.

22. The driving method according to claim 21, wherein a ratio of the period of the first bias adjustment stage to the period of the second bias adjustment stage is greater than 1.3.

23. The driving method according to claim 19, wherein a voltage value of the signal provided by the bias adjustment signal terminal is smaller than −3V.

24. The driving method according to claim 19, wherein each of the plurality of pixel circuits further comprises a light-emitting element resetting circuit, wherein the light-emitting element resetting circuit comprises a control terminal electrically connected to a fourth scanning signal terminal, a first terminal electrically connected to a reference voltage terminal, and a second terminal electrically connected to an anode of the light-emitting element;

wherein the driving method further comprises:
in at least one of the bias adjustment stage or the data writing stage, providing, by the light-emitting element resetting circuit, a signal of the reference voltage terminal to the light-emitting element under control of a signal of the fourth scanning signal terminal in such a manner that the light-emitting element is reset.

25. The driving method according to claim 24, wherein the light-emitting control circuit comprises a first light-emitting control circuit and a second light-emitting control circuit, wherein the first light-emitting control circuit comprises a control terminal electrically connected to a first light-emitting signal terminal, a first terminal electrically connected to the third node, and a second terminal electrically connected to the light-emitting element, and the second light-emitting control circuit comprises a control terminal electrically connected to a second light-emitting signal terminal, a first terminal electrically connected to a power signal terminal, and a second terminal electrically connected to the second node;

wherein said controlling, by the light-emitting control circuit, the driving current provided to the light-emitting element in the light-emitting stage, comprises:
providing, by the second light-emitting control circuit, a signal of the power signal terminal to the second node under control of a signal of the second light-emitting control signal terminal;
generating, by the driving transistor, the driving current under control of a gate voltage of the driving transistor; and
providing, by the first light-emitting control circuit, a driving current to the light-emitting element under control of a signal of the first light-emitting control signal terminal.

26. The driving method according to claim 25, wherein the driving period further comprises a gate resetting stage after the first bias adjustment stage and before the data writing stage;
wherein the driving method further comprises:
in the gate resetting stage, resetting the gate of the driving transistor.

27. The driving method according to claim 26, wherein the threshold compensation circuit comprises a control terminal electrically connected to a second scanning signal terminal, a first terminal electrically connected to the third node, and a second terminal electrically connected to the first node;
the threshold compensation circuit, the first light-emitting control circuit, and the light-emitting element resetting circuit together are reused as a gate resetting circuit;
wherein said resetting the gate of the driving transistor in the gate resetting stage comprises:
providing, by the light-emitting element resetting circuit, the signal of the reference voltage terminal to the second terminal of the first light-emitting control circuit under the control of the signal of the fourth scanning signal terminal;
providing, by the first light-emitting control circuit, the signal of the second terminal of the first light-emitting control circuit to the first terminal of the threshold compensation circuit under the control of the signal of the first light-emitting signal terminal; and
providing, by the threshold compensation circuit, the signal of the first terminal to the gate of the driving transistor under the control of the signal of the second scanning signal terminal in such a manner that the gate of the driving transistor is reset.

28. The driving method according to claim 27, further comprising:
in the gate resetting stage, providing, by the light-emitting element resetting circuit, the signal of the reference voltage terminal to the light-emitting element under the control of the signal of the fourth scanning signal terminal in such a manner that the light-emitting element is reset.

29. The driving method according to claim 19, wherein the threshold compensation circuit comprises a control terminal electrically connected to a second scanning signal terminal, a first terminal electrically connected to the third node, and a second terminal electrically connected to the first node;
the data writing circuit comprises a control terminal electrically connected to a third scanning signal terminal, a first terminal electrically connected to a data signal terminal, and a second terminal electrically connected to the second node;
wherein in the data writing stage, said writing, by the data writing circuit, the data signal into the gate of the driving transistor and detecting and self-compensating, by the threshold compensation circuit, the deviation of the threshold voltage of the driving transistor, comprises:
providing, by the data writing circuit, a signal of the data signal terminal to the second node under control of a signal of the third scanning signal terminal;
providing, by the driving transistor, a voltage signal of the second node to the third node under control of a gate voltage of the driving transistor; and
providing, by the threshold compensation circuit, a voltage signal of the third node to the first node under control of a signal of the second scanning signal terminal.

30. The driving method according to claim 19, further comprising:
determining a driving mode of the display panel;
driving the pixel circuit to operate in the data writing stage and the light-emitting stage in a case where the driving mode is a high-frequency driving mode; and
driving the pixel circuit to operate in the bias adjustment stage, the data writing stage, and the light-emitting stage in a case where the driving mode is a low-frequency driving mode.

31. The driving method according to claim 19, further comprising:
determining a driving mode of the display panel,
wherein in the case where the driving mode is the low-frequency driving mode, a display process of an image frame comprises a phase of data writing frame and a phase of holding frame,
wherein in the phase of data writing frame, the pixel circuit is driven to operate in the bias adjustment stage, the data writing stage, and the light-emitting stage; and
wherein in the phase of holding frame, the pixel circuit is driven to operate in the bias adjustment stage and the light-emitting stage.

32. The driving method according to claim 19, further comprising:
- prior to driving the display panel to display an image frame, determining whether an image to be displayed is the same as a previous image frame,
- wherein in a case where the image to be displayed is the same as the previous image frame, a process of said driving the display panel to display the image frame comprises: driving at least one of the plurality of pixel circuits to operate in the data writing stage and the light-emitting stage; and
- wherein in a case where the image to be displayed is different from the previous image frame, the process of said driving the display panel to display the image frame comprises: driving at least one of the plurality of pixel circuits to operate in the bias adjustment stage, the data writing stage, and the light-emitting stage.

33. A display device, comprising a display panel,
wherein the display panel comprises a plurality of pixel circuits,
wherein each of the plurality of pixel circuits comprises:
- a driving transistor configured to generate a driving current and comprising a gate, a first terminal, and a second terminal;
- a data writing circuit configured to provide a data signal to the driving transistor;
- a light-emitting control circuit connected in series with the driving transistor and a light-emitting element, the light-emitting control circuit configured to control whether the driving current flows through the light-emitting element or not;
- a threshold compensation circuit connected in series between the gate and the second terminal of the driving transistor, the threshold compensation circuit configured to detect and self-compensate deviation of a threshold voltage of the driving transistor, wherein the gate of the driving transistor is electrically connected to a first node, the first terminal of the driving transistor is electrically connected to a second node, the second terminal of the driving transistor is electrically connected to a third node, and the third node is connected to the light-emitting element through the light-emitting control circuit; and
- a bias adjustment circuit comprising a control terminal electrically connected to a first scanning signal terminal, a first terminal electrically connected to a bias adjustment signal terminal, and a second terminal electrically connected to the second node, wherein the bias adjustment circuit is configured to provide a signal of the bias adjustment signal terminal to the second node under control of a signal of the first scanning signal terminal in such a manner that a bias state of the driving transistor is adjusted.

* * * * *